United States Patent
Dokania et al.

(10) Patent No.: US 11,764,790 B1
(45) Date of Patent: Sep. 19, 2023

(54) MAJORITY LOGIC GATE HAVING PARAELECTRIC INPUT CAPACITORS COUPLED TO A CONDITIONING SCHEME

(71) Applicant: Kepler Computing Inc., San Francisco, CA (US)

(72) Inventors: Rajeev Kumar Dokania, Beaverton, OR (US); Amrita Mathuriya, Portland, OR (US); Rafael Rios, Austin, TX (US); Ikenna Odinaka, Durham, NC (US); Robert Menezes, Portland, OR (US); Ramamoorthy Ramesh, Moraga, CA (US); Sasikanth Manipatruni, Portland, OR (US)

(73) Assignee: KEPLER COMPUTING INC., San Francisco, CA (US)

( * ) Notice: Subject to any disclaimer, the term of this patent is extended or adjusted under 35 U.S.C. 154(b) by 186 days.

(21) Appl. No.: 17/327,662

(22) Filed: May 21, 2021

Related U.S. Application Data

(63) Continuation of application No. 17/327,648, filed on May 21, 2021, now Pat. No. 11,374,575.

(51) Int. Cl.
   *H03K 19/0948* (2006.01)
   *H03K 19/23* (2006.01)
   *H01L 49/02* (2006.01)

(52) U.S. Cl.
   CPC ............ *H03K 19/23* (2013.01); *H01L 28/55* (2013.01)

(58) Field of Classification Search
   CPC ......... H01L 28/55; H03K 19/20; H03K 19/23
   See application file for complete search history.

(56) References Cited

U.S. PATENT DOCUMENTS

| | | | |
|---|---|---|---|
| 3,108,193 A | * | 10/1963 | Schreiner ............... G11C 19/12 365/77 |
| 3,260,863 A | | 7/1966 | Burns et al. |
| 3,524,977 A | | 8/1970 | Wang |

(Continued)

FOREIGN PATENT DOCUMENTS

| | | |
|---|---|---|
| JP | 2000156472 | 6/2000 |
| KR | 20160089141 | 7/2016 |
| KR | 20170099862 A | 9/2017 |

OTHER PUBLICATIONS

International Search Report & Written Opinion notified May 19, 2022 for PCT Patent Application No. PCT/US2022/070445.

(Continued)

*Primary Examiner* — Kurtis R Bahr
(74) *Attorney, Agent, or Firm* — MUGHAL GAUDRY & FRANKLIN PC

(57) ABSTRACT

A new class of logic gates are presented that use non-linear polar material. The logic gates include multi-input majority gates. Input signals in the form of digital signals are driven to non-linear input capacitors on their respective first terminals. The second terminals of the non-linear input capacitors are coupled a summing node which provides a majority function of the inputs. In the multi-input majority or minority gates, the non-linear charge response from the non-linear input capacitors results in output voltages close to or at rail-to-rail voltage levels. In some examples, the nodes of the non-linear input capacitors are conditioned once in a while to preserve function of the multi-input majority gates.

18 Claims, 21 Drawing Sheets

(56) References Cited

U.S. PATENT DOCUMENTS

| | | | |
|---|---|---|---|
| 5,381,352 A * | 1/1995 | Shou | H03M 1/804 |
| | | | 708/7 |
| 5,818,380 A * | 10/1998 | Ito | H03M 1/0602 |
| | | | 341/94 |
| 5,835,045 A | 11/1998 | Ogawa et al. | |
| 5,926,057 A | 7/1999 | Ogawa et al. | |
| 5,978,827 A * | 11/1999 | Ichikawa | H03K 19/23 |
| | | | 708/626 |
| 6,043,675 A * | 3/2000 | Miyamoto | H03M 1/145 |
| | | | 326/11 |
| 6,166,583 A * | 12/2000 | Kochi | H03M 1/42 |
| | | | 708/1 |
| 6,198,652 B1 | 3/2001 | Kawakubo et al. | |
| 6,208,282 B1 | 3/2001 | Miyamoto | |
| 7,837,110 B1 | 11/2010 | Hess et al. | |
| 7,897,454 B2 | 3/2011 | Wang et al. | |
| 8,247,855 B2 | 8/2012 | Summerfelt | |
| 9,276,040 B1 | 3/2016 | Marshall et al. | |
| 9,305,929 B1 | 4/2016 | Karda et al. | |
| 9,324,405 B2 | 4/2016 | Evans, Jr. | |
| 9,697,882 B1 | 7/2017 | Evans, Jr. | |
| 9,858,979 B1 | 1/2018 | Derner et al. | |
| 9,973,329 B2 | 5/2018 | Hood et al. | |
| 10,217,522 B2 | 2/2019 | Wang et al. | |
| 10,446,214 B1 | 10/2019 | Vincenzo et al. | |
| 10,679,782 B2 | 6/2020 | Manipatruni | |
| 10,944,404 B1 * | 3/2021 | Manipatruni | G06F 7/501 |
| 10,951,213 B1 | 3/2021 | Manipatruni et al. | |
| 11,043,259 B2 | 6/2021 | Wentzlaff et al. | |
| 11,418,197 B1 | 8/2022 | Dokania et al. | |
| 11,501,813 B1 | 11/2022 | Dokania et al. | |
| 11,521,667 B1 | 12/2022 | Dokania et al. | |
| 2001/0052619 A1 * | 12/2001 | Inoue | H01L 27/1211 |
| | | | 257/347 |
| 2002/0163058 A1 | 11/2002 | Chen et al. | |
| 2004/0183508 A1 | 9/2004 | Toyoda et al. | |
| 2009/0058460 A1 | 3/2009 | Kang | |
| 2012/0107965 A1 | 5/2012 | Sashida | |
| 2013/0057301 A1 | 3/2013 | Balachandran et al. | |
| 2015/0337983 A1 | 11/2015 | Dolenti et al. | |
| 2017/0243917 A1 | 8/2017 | Manipatruni et al. | |
| 2017/0337983 A1 | 11/2017 | Wang et al. | |
| 2018/0025766 A1 | 1/2018 | Dietrich et al. | |
| 2018/0076815 A1 | 3/2018 | Vigeant et al. | |
| 2018/0240583 A1 | 8/2018 | Manipatruni et al. | |
| 2019/0051812 A1 | 2/2019 | Shih et al. | |
| 2019/0074295 A1 | 3/2019 | Schroeder | |
| 2019/0318775 A1 | 10/2019 | Rakshit et al. | |
| 2019/0348098 A1 | 11/2019 | El-Mansouri | |
| 2020/0051607 A1 | 2/2020 | Pan et al. | |
| 2020/0091407 A1 * | 3/2020 | Liu | G11C 11/18 |
| 2020/0091414 A1 | 3/2020 | Liu et al. | |
| 2020/0210233 A1 | 7/2020 | Chen et al. | |
| 2021/0203325 A1 | 7/2021 | Manipatruni et al. | |

OTHER PUBLICATIONS

Final Office Action notified Dec. 9, 2021 for U.S. Appl. No. 17/327,614.

Non-Final Office Action notified Jan. 24, 2022 for U.S. Appl. No. 17/327,648.

Non-Final Office Action notified Jan. 24, 2022 for U.S. Appl. No. 17/327,649.

Non-Final Office Action notified Jan. 24, 2022 for U.S. Appl. No. 17/327,659.

Non-Final Office Action notified Nov. 16, 2021 for U.S. Appl. No. 17/327,614.

Notice of Allowance notified Dec. 7, 2021 for U.S. Appl. No. 17/327,652.

Notice of Allowance notified Jan. 12, 2021 for U.S. Appl. No. 17/327,614.

Notice of Allowance notified Jan. 28, 2022 for U.S. Appl. No. 17/327,651.

"Kepler Logic", Named for Amalie Emmy Noether @ https://en.wikipedia.org/wiki/Emmy_Noether.

Fichtner, S. et al., "AlScN: A III-V semiconductor based ferroelectric", Journal of Applied Physics 125, 114103 (2019); https://doi.org/10.1063/1.5084945, 2019, 28.

Muller, J. et al., "Ferroelectric Hafnium Oxide Based Materials and Devices: Assessment of Current Status and Future Prospects", ECS Journal of Solid State Science and Technology, 4 (5) N30-N35 (215). 6 pages.

Muroga, S., "Threshold Logic and its Applications", New York, Wiley-Interscience, published 1971.

Subbarao, E., "Ferroelectric and antiferroelectric materials", Department of Metallurgical Engineering, Indian Institute of Technology, Kanpur, IN. First published Mar. 15, 2011. Ferroelectrics, 5:1, 267-280.

Notice of Allowance notified Apr. 28, 2022 for U.S. Appl. No. 17/327,649.

Notice of Allowance notified Mar. 7, 2022 for U.S. Appl. No. 17/327,659.

Notice of Allowance notified Mar. 11, 2022 for U.S. Appl. No. 17/327,648.

Non-Final Office Action notified Apr. 6, 2023 for U.S. Appl. No. 17/659,981.

Non-Final Office Action notified Apr. 6, 2023 for U.S. Appl. No. 17/659,992.

Non-Final Office Action notified Dec. 12, 2022 for U.S. Appl. No. 17/808,290.

Non-Final Office Action notified Mar. 16, 2023 for U.S. Appl. No. 17/327,660.

Notice of Allowance notified Apr. 13, 2023 for U.S. Appl. No. 17/327,660.

Notice of Allowance notified Feb. 2, 2023 for U.S. Appl. No. 17/552,079.

Notice of Allowance notified Feb. 17, 2023 for U.S. Appl. No. 17/808,290.

Notice of Allowance notified Jan. 30, 2023 for U.S. Appl. No. 17/550,910.

Notice of Allowance notified Jan. 31, 2023 for U.S. Appl. No. 17/552,101.

Notice of Allowance notified Mar. 7, 2023 for U.S. Appl. No. 17/550,908.

Notice of Allowance notified Mar. 13, 2023 for U.S. Appl. No. 17/552,107.

Notice of Allowance notified Mar. 17, 2023 for U.S. Appl. No. 17/552,247.

* cited by examiner

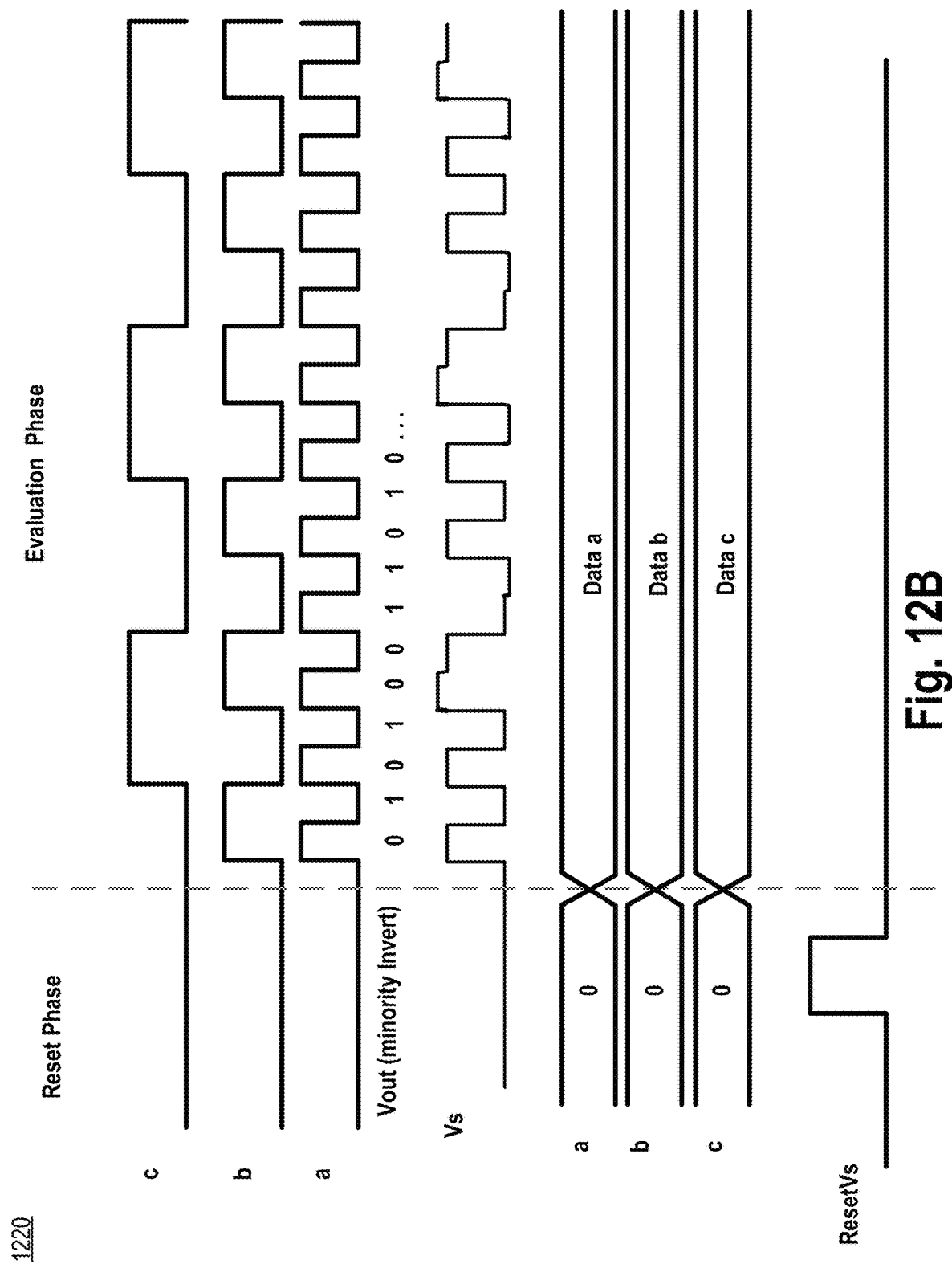

MAJORITY LOGIC GATE HAVING PARAELECTRIC INPUT CAPACITORS COUPLED TO A CONDITIONING SCHEME

CLAIM OF PRIORITY

This application is a continuation of, and claims the benefit of priority to U.S. patent application Ser. No. 17/327,648, filed on May 21, 2021, titled "MAJORITY LOGIC GATE WITH NON-LINEAR INPUT CAPACITORS AND CONDITIONING LOGIC," and now issued as U.S. Pat. No. 11,374,575 on Jun. 28, 2022, and which is incorporated by reference in entirety.

BACKGROUND

Typical logic gates such as an AND gate, an OR gate, or a logic gate that receives three or more inputs may consist of nine or more transistors per logic gate and many interconnects to connect the various transistors. As the number of transistors increases, power consumption also increases. As devices are pushing down the power envelope to save battery power, existing circuit architecture for multi-input logic gates present challenges to the goal of lower power consumption.

The background description provided here is for the purpose of generally presenting the context of the disclosure. Unless otherwise indicated here, the material described in this section is not prior art to the claims in this application and are not admitted to be prior art by inclusion in this section.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIGS. 12A-B illustrate a conditioning mechanism with a pull-down scheme and associated timing diagram for a 3-input majority gate having paraelectric input capacitors, in accordance with some embodiments.

DETAILED DESCRIPTION

Figure 1:
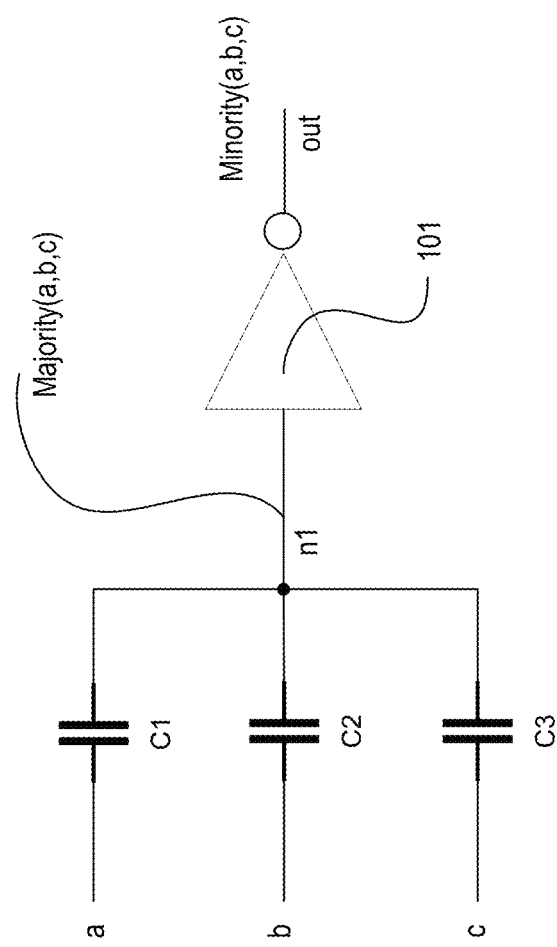
FIG. 1 illustrates a 3-input majority gate using linear input capacitors resulting in non-rail-to-rail voltage swing at an input of a driver and leakage through the driver.

Some embodiments describe a new class of logic gates that use non-linear polar material. The logic gates include multi-input majority or minority gates. Input signals in the form digital signals are driven to first terminals of capacitors with non-linear polar material. The second terminals of the capacitors with non-linear polar material are coupled to form a majority node (or a summing node). Majority function of the input signals occurs on this node. The majority node is then coupled to a capacitive node or device such as a gate terminal of a transistor. In various embodiments, this capacitive node is connected to a logic gate such as a CMOS circuitry, buffer, inverter, NAND gate, NOR gate, multiplexer, XOR gate, etc. The output of the logic can be used to drive additional multi-input majority or minority gates or to devices of other types of transistor technologies. The logic gate can be implemented in any suitable technology such as complementary metal oxide semiconductor (CMOS), tunneling field effect transistor (TFET), GaAs based transistors, bipolar junction transistors (BJTs), Bi-CMOS transistors, etc. As such, majority or minority gate of various embodiments can be combined with existing transistor technologies. In various embodiments, the summing node or the majority node has a signal which reaches rail-to-rail (e.g., from ground to Vdd) resulting in lower leakage in the subsequent logic gate. One drawback of using linear input capacitors, as opposed to non-linear input capacitors, is that the voltage on the summing node or majority output node does not reach rail-to-rail voltage, resulting in high leakage in the output driver or logic gate. Such issues are resolved by the multi-input majority or minority gates of various embodiments. In the multi-input majority or minority gates of various embodiments the non-linear charge response from the non-linear input capacitors results in output voltages close to rail-to-rail. Bringing the majority output close to rail-to-rail voltage eliminates the high leakage problem faced from majority gates formed using linear input capacitors.

There are many technical effects of the various embodiments. For example, extremely compact basic logic gates are formed using non-linear capacitors. The non-linear capacitors comprise non-linear polar material that can be ferroelectric material, para-electric material, or non-linear dielectric. The logic gates of various embodiments become the basis of adders, multipliers, sequential circuits, and other complex circuits, etc. The majority gate of various embodiments lowers the power consumption because they do not use switching transistors and the interconnect routings are much fewer than the interconnect routings used in transitional CMOS logic gates. For example, 10× fewer interconnect length is used by the majority gate of various embodiments than traditional CMOS circuits for the same function and performance. The capacitors with non-linear polar material provide non-volatility that allows for intermittent operation and zero power drain when not in use.

For example, a processor having such logic gates can enter and exit various types of low power states without having to worry about losing data. Since the capacitor with non-linear polar material can store charge from low energy devices, the entire processor can operate at much lower voltage level from the power supply, which reduces overall power of the processor. Further, very low voltage switching (e.g., 100 mV) of the non-linear polar material state allows for low swing signal switching, which in turn results in low power.

The capacitors with non-linear polar material can be used with any type of transistor. For example, the capacitors with non-linear polar material of various embodiments can be used with planar or non-planar transistors. The transistors can be formed in the frontend or backend of a die. The capacitors with non-linear polar material can be formed in the frontend or backend of the die. As such, the logic gates can be packed with high density compared to traditional logic gates. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus, which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

Here, the term "analog signal" generally refers to any continuous signal for which the time varying feature (variable) of the signal is a representation of some other time varying quantity, i.e., analogous to another time varying signal.

Here, the term "digital signal" generally refers to a physical signal that is a representation of a sequence of discrete values (a quantified discrete-time signal), for example of an arbitrary bit stream, or of a digitized (sampled and analog-to-digital converted) analog signal.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, a source, or a drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single FET (field effect transistor).

Here, the term "backend" generally refers to a section of a die which is opposite of a "frontend" and where an IC (integrated circuit) package couples to IC die bumps. For example, high-level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

It is pointed out that those elements of the figures having the same reference numbers (or names) as the elements of any other figure can operate or function in any manner similar to that described, but are not limited to such.

FIG. 1 illustrates 3-input majority gate 100 using linear input capacitors resulting in non-rail-to-rail voltage swing at an input of a driver and leakage through the driver. 3-input majority gate 100 is a typical majority gate that uses linear input capacitors C1, C2, and C3 that are coupled to inputs a, b, and c, respectively, on one end and to a summing node n1 on another end. The summing node is where the majority function is performed e.g., Majority(a,b,c). The voltage developed on node n1 is then used to drive a CMOS driver 101. If CMOS driver 101 is an inverter, the output "out" provides a minority function of the inputs e.g., Minority(a, b,c). Here, the voltage developed on node n1 is not rail-to-rail voltage. As a result, standby current rushes through driver 101 because some of its transistors are not fully off due to the non-rail-to-rail voltage on node n1. As such, energy is wasted and 3-input majority gate 100 becomes unsuitable gate for use in any low power applications.

Figure 2:
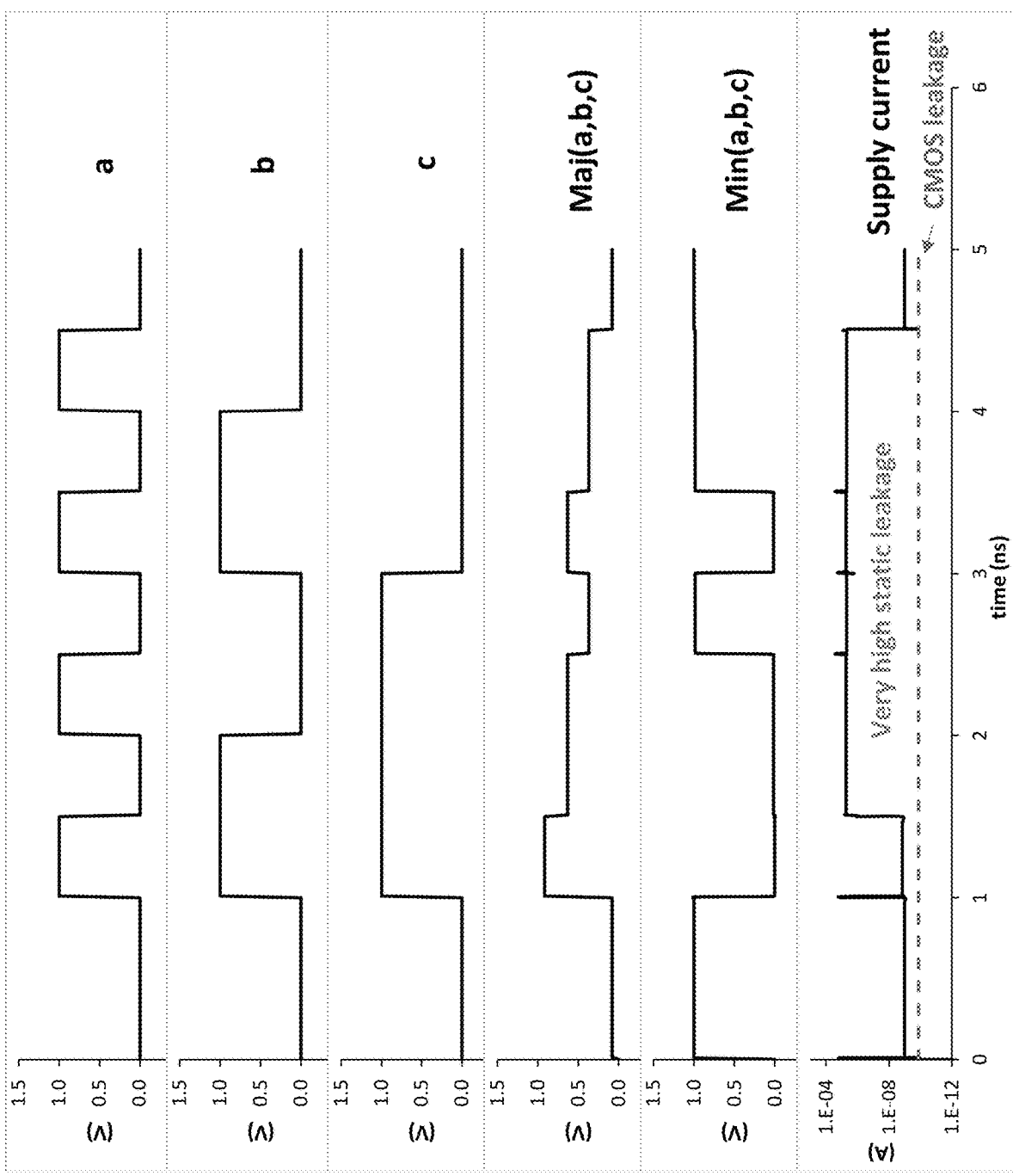
FIG. 2 illustrates a timing diagram showing operation of 3-input majority gate of FIG. 1 resulting in high static leakage.

FIG. 2 illustrates timing diagram 200 showing operation of 3-input majority gate of FIG. 1 resulting in high static leakage. Timing diagram 200 shows digital input signals for inputs a, b, and c. Depending on the logic levels of inputs a, b, and c, a voltage is developed on summing node n1. This voltage is illustrated by waveform Maj(a,b,c). The voltage driven by inverter 101 on node "out" is the minority output, Min(a,b,c). The last waveform in the stack of waveforms shows the impact of using linear input capacitors as the basis of performing a majority function. When the voltage on node n1 is between Vdd and ground, crowbar current (also referred to as standby current) passes through the supply rail to the ground in CMOS driver 101. This crowbar current is substantially larger than leakage current (e.g., current through CMOS driver 101 when all its devices are off). As a result, 3-input majority gate 100 becomes unsuitable gate for use in any low power applications.

Figure 3:
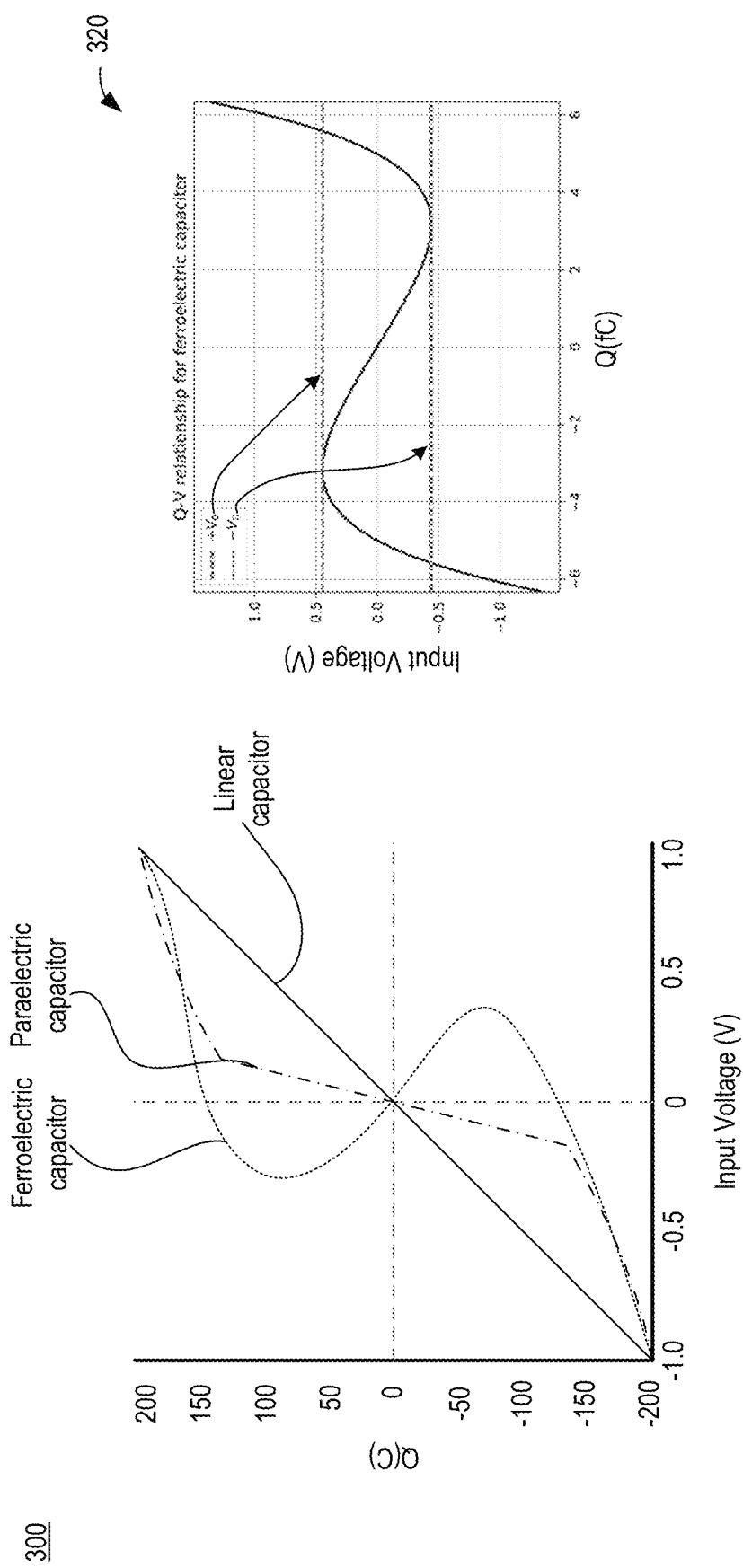
FIG. 3 illustrates a plot showing charge transfer function for non-linear capacitors compared to a linear capacitor.

FIG. 3 illustrates a set of plots showing charge transfer function for non-linear capacitors compared to a linear capacitor. Plot 300 compares the transfer function for a linear capacitor, a paraelectric capacitor (a non-linear capacitor) and a ferroelectric capacitor (a non-linear capacitor). Here, x-axis is input voltage or voltage across the capacitor, while the y-axis is the charge on the capacitor. Plot 320 shows the charge and voltage relationship for a ferroelectric capacitor. A capacitor with ferroelectric material (also referred to as a FEC) is a non-linear capacitor with its potential $V_F(Q_F)$ as a cubic function of its charge. Plot 320 illustrates characteristics of a FEC. Plot 320 is a charge-voltage (Q-V) plot for a block of $Pb(Zr_{0.5}Ti_{0.5})O_3$ of area $(100 \text{ nm})^2$ and thickness 20 nm (nanometer). Plot 320 shows local extrema at $+/-V_o$ indicated by the dashed lines. Here, the term $V_c$ is the coercive voltage. In applying a potential V across the FEC, its charge can be unambiguously determined only for $|V|>V_o$. Otherwise, the charge of the FEC is subject to hysteresis effects.

Figure 4:
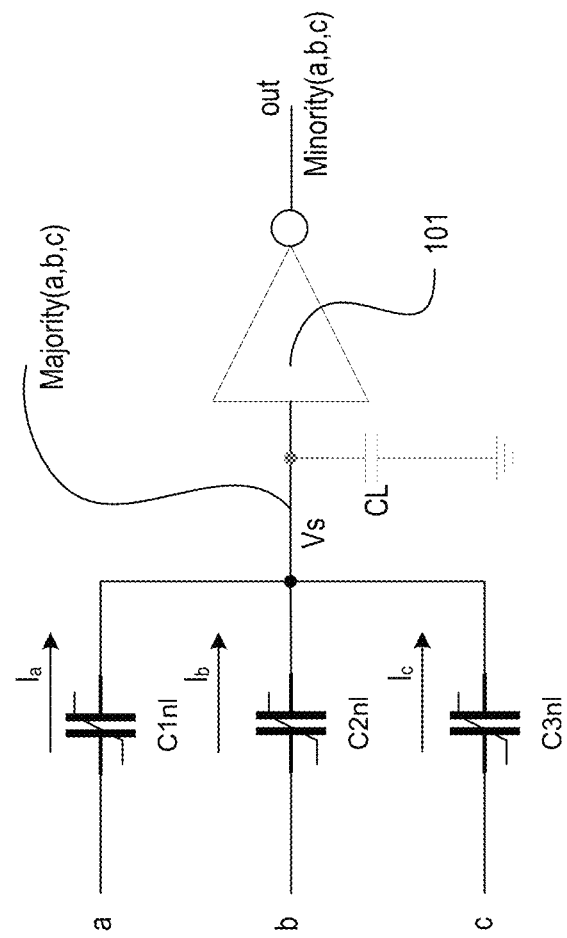
FIG. 4 illustrates a 3-input majority gate using non-linear input capacitors, in accordance with some embodiments.

FIG. 4 illustrates 3-input majority gate 400 using non-linear input capacitors, in accordance with some embodiments. In some embodiments, 3-input majority gate 400 comprises non-linear input capacitors C1n1, C2n1, and C3n1 that receives digital signals a, b, and c, respectively. Here, signal names and node names are interchangeably used. For example, 'a' refers to node 'a' or signal 'a' depending on the context of the sentence. One end or terminal of capacitor C1n1 is coupled to node a while the other end of capacitor C1n1 is coupled to summing node Vs. The same is true for other non-linear capacitors C2n1 and C3n1 as shown. In some embodiments, 3-input majority gate 400 comprises a driver circuitry 101. In this example, driver circuitry 101 is an inverter. In other embodiments, other types of driver circuitries can be used such as NAND gate, NOR gate, multiplexer, buffer, and other logic gates. The majority function is performed at summing node Vs as Majority(a,b,c). In this example, since driver 101 is an inverter, minority function is performed at output "out" as Minority(a,b,c).

In some embodiments, in addition to the gate capacitance of driver circuitry 101, an additional linear capacitor CL is coupled to summing node Vs and ground as shown. In some embodiments, this linear capacitor CL is a non-ferroelectric capacitor. In some embodiments, the non-ferroelectric capacitor includes one of: dielectric capacitor, para-electric capacitor, or non-linear dielectric capacitor. A dielectric capacitor comprises first and second metal plates with a dielectric between them. Examples of such dielectrics are: HfO, ABO3 perovskites, nitrides, oxy-fluorides, oxides, etc. A para-electric capacitor comprises first and second metal plates with a para-electric material between them. In some embodiments, f-orbital materials (e.g., lanthanides) are doped to the ferroelectric materials to make paraelectric material. Examples of room temperature paraelectric material include: SrTiO3, Ba(x)Sr(y)TiO3 (where x is −0.5, and y is 0.95)), HfZrO2, Hf—Si—O, La-substituted PbTiO3, PMN-PT based relaxor ferroelectrics. A dielectric capacitor comprises first and second metal plates with non-linear dielectric capacitor between them. The range for dielectric constant is 1.2 to 10000. The capacitor CL can be implemented as MIM (metal-insulator-metal) capacitor technology, transistor gate capacitor, hybrid of metal capacitors or transistor capacitor. The capacitor CL can be implemented as MIM (metal-insulator-metal) capacitor technology, transistor gate capacitor, or hybrid of metal capacitors or transistor capacitor.

In some embodiments, the non-linear input capacitors $C1n1$, $C2n1$, and $C3n1$ comprise non-linear polar material. In some embodiments, the non-linear polar material includes one of: ferroelectric (FE) material, para-electric material, relaxor ferroelectric, or non-linear dielectric. In various embodiments, para-electric material is the same as FE material but with chemical doping of the active ferroelectric ion by an ion with no polar distortion. In some cases, the non-polar ions are non-s orbital ions formed with p, d, f external orbitals. In some embodiments, non-linear dielectric materials are same as para-electric materials, relaxors, and dipolar glasses.

In some embodiments, f-orbital materials (e.g., lanthanides) are doped to the ferroelectric material to make paraelectric material. Examples of room temperature paraelectric material include: SrTiO3, Ba(x)Sr(y)TiO3 (where x is −0.5, and y is 0.95), HfZrO2, Hf—Si—O, La-substituted PbTiO3, and PMN-PT based relaxor ferroelectrics.

In various embodiments, the FE material can be any suitable low voltage FE material that allows the FE material to switch its state by a low voltage (e.g., 100 mV). In some embodiments, the FE material comprises a perovskite of the type $ABO_3$, where 'A' and B' are two cations of different sizes, and 'O' is oxygen which is an anion that bonds to both the cations. Generally, the size of A atoms is larger than the size of B atoms. In some embodiments, the perovskite can be doped (e.g., by La or Lanthanides). Perovskites can be suitably doped to achieve a spontaneous distortion in a range of 0.3 to 2%. For example, for chemically substituted lead titanate such as Zr in Ti site; La, Nb in Ti site, the concentration of these substitutes is such that it achieves the spontaneous distortion in the range of 0.3 to 2%. For chemically substituted BiFeO3, BiCrO3, BiCoO3 class of materials, La or rare earth substitution into the Bi site can tune the spontaneous distortion. In some embodiments, perovskite includes one of: BaTiO3, PbTiO3, KNbO3, or NaTaO3.

Threshold in the FE material has a highly non-linear transfer function in the polarization vs. voltage response. The threshold is related to: a) non-linearity of switching transfer function; and b) the squareness of the FE switching. The non-linearity of switching transfer function is the width of the derivative of the polarization vs. voltage plot. The squareness is defined by the ratio of the remnant polarization to the saturation polarization; perfect squareness will show a value of 1.

The squareness of the FE switching can be suitably manipulated with chemical substitution. For example, in PbTiO3 a P-E (polarization-electric field) square loop can be modified by La or Nb substitution to create an S-shaped loop. The shape can be systematically tuned to ultimately yield a non-linear dielectric. The squareness of the FE switching can also be changed by the granularity of the FE layer. A perfect epitaxial, single crystalline FE layer will show higher squareness (e.g., ratio is closer to 1) compared to a poly crystalline FE. This perfect epitaxial can be accomplished by the use of lattice matched bottom and top electrodes. In one example, BiFeO (BFO) can be epitaxially synthesized using a lattice matched SrRuO3 bottom electrode yielding P-E loops that are square. Progressive doping with La will reduce the squareness.

In some embodiments, the FE material is contacted with a conductive metal oxide that includes one of the conducting perovskite metallic oxides exemplified by: La—Sr—CoO3, SrRuO3, La—Sr—MnO3, YBa2Cu3O7, Bi2Sr2CaCu2O8, LaNiO3, and ReO3.

In some embodiments, the FE material comprises a stack of layers including low voltage FE material between (or sandwiched between) conductive oxides. In various embodiments, when FE material is a perovskite, the conductive oxides are of the type $AA'BB'O_3$. A' is a dopant for atomic site A, it can be an element from the Lanthanides series. B' is a dopant for atomic site B, it can be an element from the transition metal elements especially Sc, Ti, V, Cr, Mn, Fe, Co, Ni, Cu, Zn. A' may have the same valency of site A, with a different ferroelectric polarizability.

In some embodiments, the FE material comprises hexagonal ferroelectrics of the type h-RMnO3, where R is a rare earth element such as: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In some embodiments, hexagonal FE includes one of: YMnO3 or LuFeO3. In various embodiments, when the FE material comprises hexagonal ferroelectrics, the conductive oxides adjacent to the FE material are of A2O3 (e.g., In2O3, Fe2O3) and AB2O3 type, where 'A' is a rare earth element and B is Mn.

In some embodiments, FE material comprises improper FE material. An improper ferroelectric is a ferroelectric where the primary order parameter is an order mechanism such as strain or buckling of the atomic order. Examples of improper FE material are LuFeO3 class of materials or super lattice of ferroelectric and paraelectric materials PbTiO3 (PTO) and SnTiO3 (STO), respectively, and LaAlO3 (LAO) and STO, respectively. For example, a super lattice of [PTO/STO]n or [LAO/STO]n, where 'n' is between 1 to 100. While various embodiments here are described with reference to ferroelectric material for storing the charge state, the embodiments are also applicable for paraelectric material. For example, the capacitor of various embodiments can be formed using paraelectric material instead of ferroelectric material.

In some embodiments, the FE material includes one of: Hafnium (Hf), Zirconium (Zr), Aluminum (Al), Silicon (Si), their oxides or their alloyed oxides. In some embodiments, FE material includes one of: Al(1−x)Sc(x)N, Ga(1−x)Sc(x)N, Al(1−x)Y(x)N or Al(1−x−y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction. In some embodiments, the FE material includes Bismuth ferrite (BFO), lead zirconate titanate (PZT), BFO with doping material, or PZT with doping material, wherein the doping material is one of Nb or relaxor ferroelectrics such as PMN-PT.

In some embodiments, the FE material includes Bismuth ferrite (BFO), BFO with a doping material where in the doping material is one of Lanthanum, or any element from the lanthanide series of the periodic table. In some embodiments, the FE material includes lead zirconium titanate (PZT), or PZT with a doping material, wherein the doping material is one of La, Nb. In some embodiments, the FE material includes a relaxor ferroelectric including one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST).

In some embodiments, the FE material includes Hafnium oxides of the form Hf1−x Ex Oy where E can be Al, Ca, Ce, Dy, Er, Gd, Ge, La, Sc, Si, Sr, Sn, or Y. In some embodiments, FE material 105 includes Niobate type compounds LiNbO3, LiTaO3, Lithium iron Tantalum Oxy Fluoride, Barium Strontium Niobate, Sodium Barium Niobate, or Potassium strontium niobate.

In some embodiments, the FE material comprises multiple layers. For example, alternating layers of [Bi2O2]2+, and pseudo-perovskite blocks (Bi4Ti3O12 and related Aurivillius phases), with perovskite layers that are n octahedral layers in thickness can be used.

In some embodiments, the FE material comprises organic material. For example, Polyvinylidene fluoride or polyvinylidene difluoride (PVDF). The FE material is between two electrodes. These electrodes are conducting electrodes. In some embodiments, the electrodes are perovskite templated conductors. In such a templated structure, a thin layer (e.g., approximately 10 nm) of a perovskite conductor (such as SrRuO3) is coated on top of IrO2, RuO2, PdO2, or PtO2 (which have a non-perovskite structure but higher conductivity) to provide a seed or template for the growth of pure perovskite ferroelectric at low temperatures. In some embodiments, when the ferroelectric comprises hexagonal ferroelectric material, the electrodes can have hexagonal metals, spinels, or cubic metals. Examples of hexagonal metals include: PtCoO2, PdCoO2, and other delafossite structured hexagonal metallic oxides such as Al-doped ZnO. Examples of spinels include Fe3O4 and LiV2O4. Examples of cubic metals include Indium Tin Oxide (ITO) such as Sn-doped In2O3.

The majority function is performed at the summing node Vs, and the resulting voltage is projected on to capacitance of driver circuitry 101. For example, the majority function of the currents ($I_a$, $I_b$, and $I_c$) on node Vs results in a resultant current that charges capacitor 105. Table 1 illustrates the majority function f(Majority a, b, c).

TABLE 1

| a | b | c | Vs (f(Majority a, b, c)) |
|---|---|---|---|
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

The charge developed on node Vs produces a voltage and current that is the output of the majority gate 400. Any suitable driver 101 can drive this output. For example, a non-FE logic, FE logic, CMOS logic, BJT logic, etc. can be used to drive the output to a downstream logic. Examples of the drivers include inverters, buffers, NAND gates, NOR gates, XOR gates, amplifiers, comparators, digital-to-analog converters, analog-to-digital converters, multiplexers, etc.

While FIG. 4 illustrates a 3-input majority gate, the same concept can be extended to more than 3 inputs to make an N-input majority gate, where N is greater than 2. In various embodiments, 'N' is an odd number. For example, a 5-input majority gate is similar to a 3-input majority gate 400 but for additional inputs 'd' and 'e'. These inputs can come from the same drivers or from different drivers.

In some embodiments, the 3-input majority gate can be configured as a fast inverter with a much faster propagation delay compared to a similar sized (in terms of area footprint) CMOS inverter. This is particularly useful when the inputs have a significantly slower slope compared to the propagation delay through the non-linear input capacitors. One way to configurate the 3-input majority gate as an inverter is to set one input to a logic high (e.g., b=1) and set another input to a logic low (e.g., b=0). The third input is the driving input which is to be inverted. The inversion will be at the Vs node. The same technique can also be applied to N-input majority gate, where 'N' is 1 or any other odd number. In an N-input majority gate, (N−1)/2 inputs are set to '1' and (N−1)/2 inputs are set to '0', and one input is used to decide the inversion function. It will be appreciated that the various embodiments are described as a majority gate, the same concepts are applicable to a minority gate. In a minority gate the driving circuitry is an inverting circuitry coupled to the summing node Vs. The minority function is seen at the output of the inverting circuitry.

In some embodiments, (2N−1) input majority gate can operate as an N-input AND gate where (N−1) inputs of the majority gate are set to zero. The AND function will be seen at the summing node Vs. Similarly, N-input NAND, OR, NOR gates can be realized. In various embodiments, the summing node Vs is driven by a driver circuitry (e.g., inverter, buffer, NAND gate, AND gate, OR gate, NOR gate, or any other logic circuitry). However, driver circuitry 101 can be replaced with another majority or minority gate. In one such embodiment, the storage node Vs is directly coupled to a non-linear capacitor of another majority or minority gate.

Any logic function $f(x_1, x_2, \ldots x_n)$ can be represented by two levels of logic as given by the min-term expansion:

$$f(x_1, x_2, \ldots x_n) = \bigvee_{C_1, C_2, \ldots C_n} \bigwedge_{x_1}^{C_1} \bigwedge_{x_2}^{C_2} \bigwedge_{x_3}^{C_3} \ldots \bigwedge_{x_n}^{C_n} f(x_1, x_2, \ldots x_n)$$

where $C_i$ is either 0 or 1. When $C_i$ is 1, $x_i^{C_i} = x_i$ (the input is used in its original form). When $C_i$ is 0, $x_i^{C_i} = \overline{x_i}$ (the input is used in its inverted form). The first level of logic is represented by at most $2^n$ AND gates (s), one for each of the $2^n$ possible combinations of 0 and 1 for $C_1, C_2, \ldots C_n$. The second level of logic is represented by a single OR gate (V). Each operand of the OR gate is a representation of a row in the truth table for $f(x_1, x_2, \ldots x_n)$.

A (2N−1)-input majority gate can represent an N-input AND gate, by tying (N−1) of the majority gate's inputs to a ground level. Similarly, a (2N−1)-input majority gate can represent an N-input OR gate, by tying (N−1) of the majority gate's inputs to a supply level (Vdd). Since a majority gate can represent AND and OR gates, and the inputs to the AND and OR gates are either original or inverted forms of the input digital signals, any logic function can be represented by majority gates and inverters only, in accordance with some embodiments.

Figure 5:
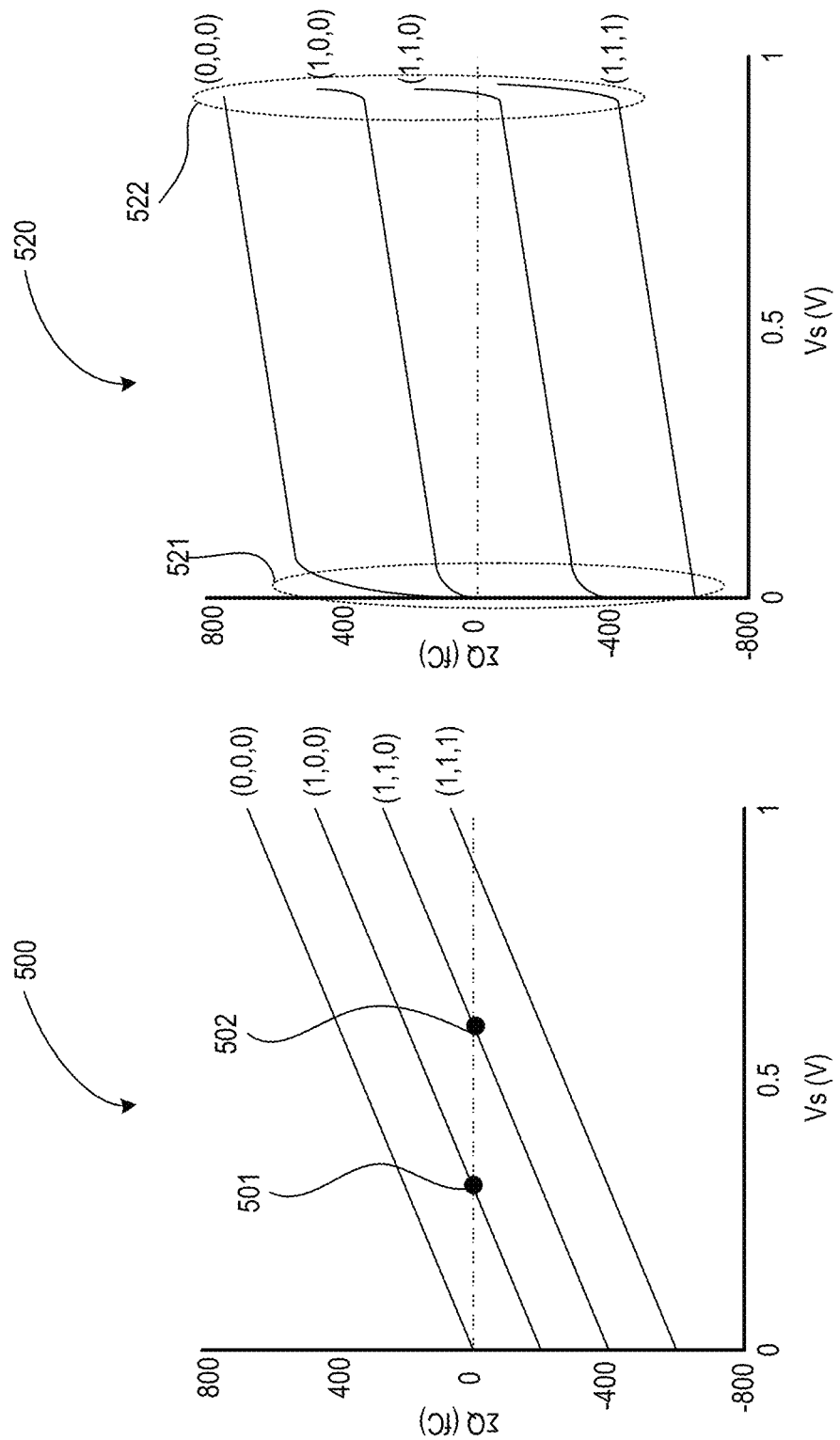
FIG. 5 illustrates a set of plots showing logic state separation for non-linear capacitors compared to a linear capacitor, in accordance with some embodiments.

FIG. 5 illustrates a set of plots 500 and 520 showing logic state separation for non-linear capacitors compared to a linear capacitor, in accordance with some embodiments. The sum of all charges must be zero to determine Vs for given sets of inputs $V_a$, $V_b$, and $V_c$ (which are voltages on nodes a, b, and c, respectively) as follows:

$$\Sigma Q(V_s) = Q_a(V_a - V_s) + Q_b(V_b - V_s) + Q_c(V_c - V_s) - C_L V_s = 0$$

Plot 500 shows sum of charges for different values of $V_a$, $V_b$, and $V_c$ when the input capacitors are linear capacitors as in FIG. 1. Plot 520 shows sum of charges for different values of $V_a$, $V_b$, and $V_c$ when the input capacitors are non-linear capacitors as in FIG. 4. The different values are: $V_a=0$, $V_b=0$, and $V_c=0$; $V_a=1$, $V_b=0$, and $V_c=1$; $V_a=1$, $V_b=0$, and $V_c=0$; and $V_a=1$, $V_b=1$, and $V_c=1$.

Plot 500 shows two points 501 and 502 for inputs (1,0,0) for ($V_a$, $V_b$, and $V_c$) and (1,1,0) which do not provide a clear logic level of 0 or 1. Inputs (1,0,0) for ($V_a$, $V_b$, and $V_c$) are expected to generate a 0 on node n1, but results in a higher voltage closer to 0.3, which is too close to a threshold voltage of transistor of driver circuitry 101. Inputs (1,1,0) for ($V_a$, $V_b$, and $V_c$) are expected to generate a 1 on node n1, but results in a lower voltage closer to 0.7. Such voltages on node n1 result in crowbar current through driver circuitry 101. Plot 520 shows the desired majority gate solution where all input combinations result in clear voltage levels of 0 (e.g., 521) or 1 (522).

Figure 6A:
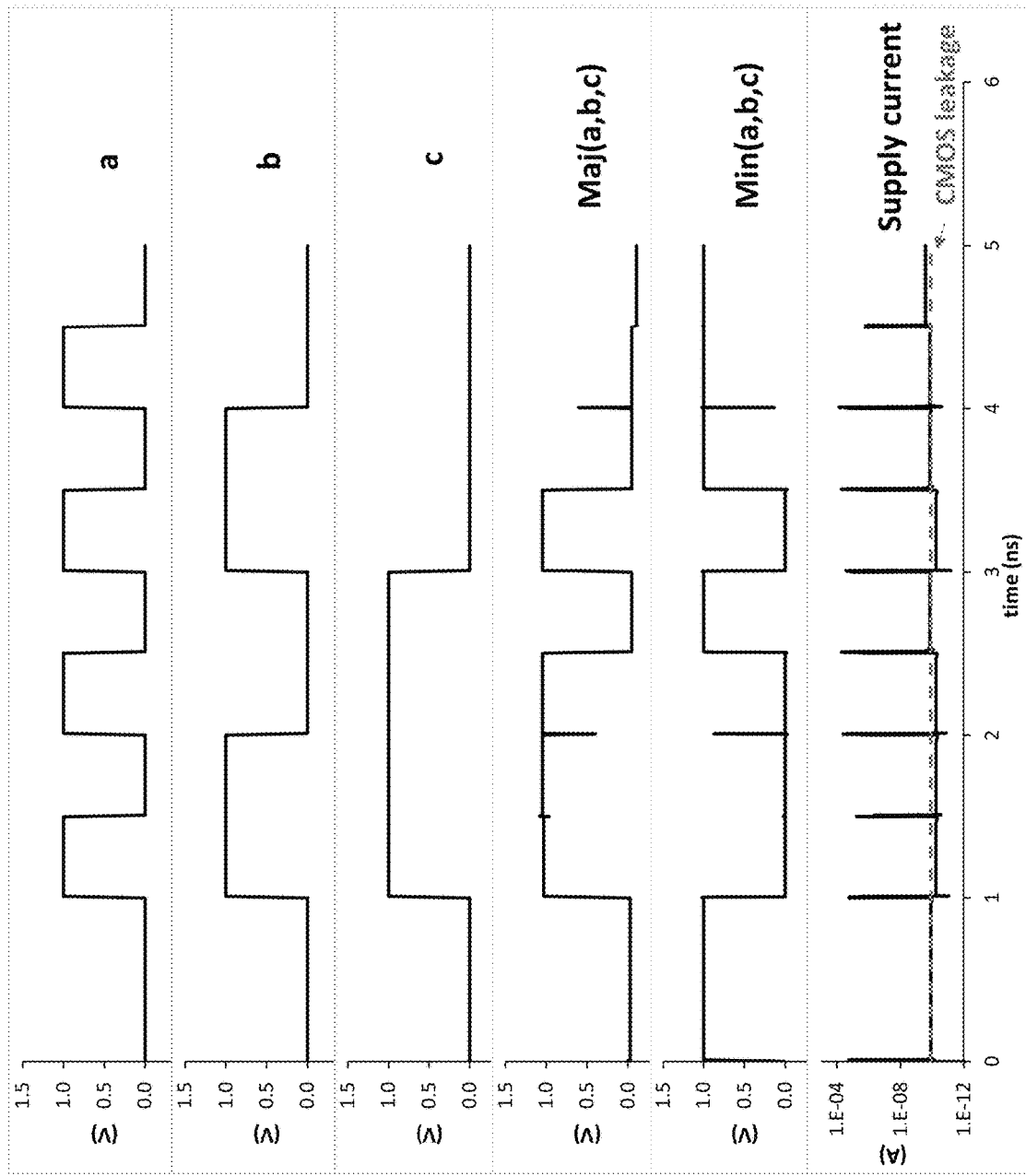
FIG. 6A illustrates a timing diagram for a 3-input majority or minority gate using ferroelectric input capacitors, in accordance with some embodiments.
Figure 6B:
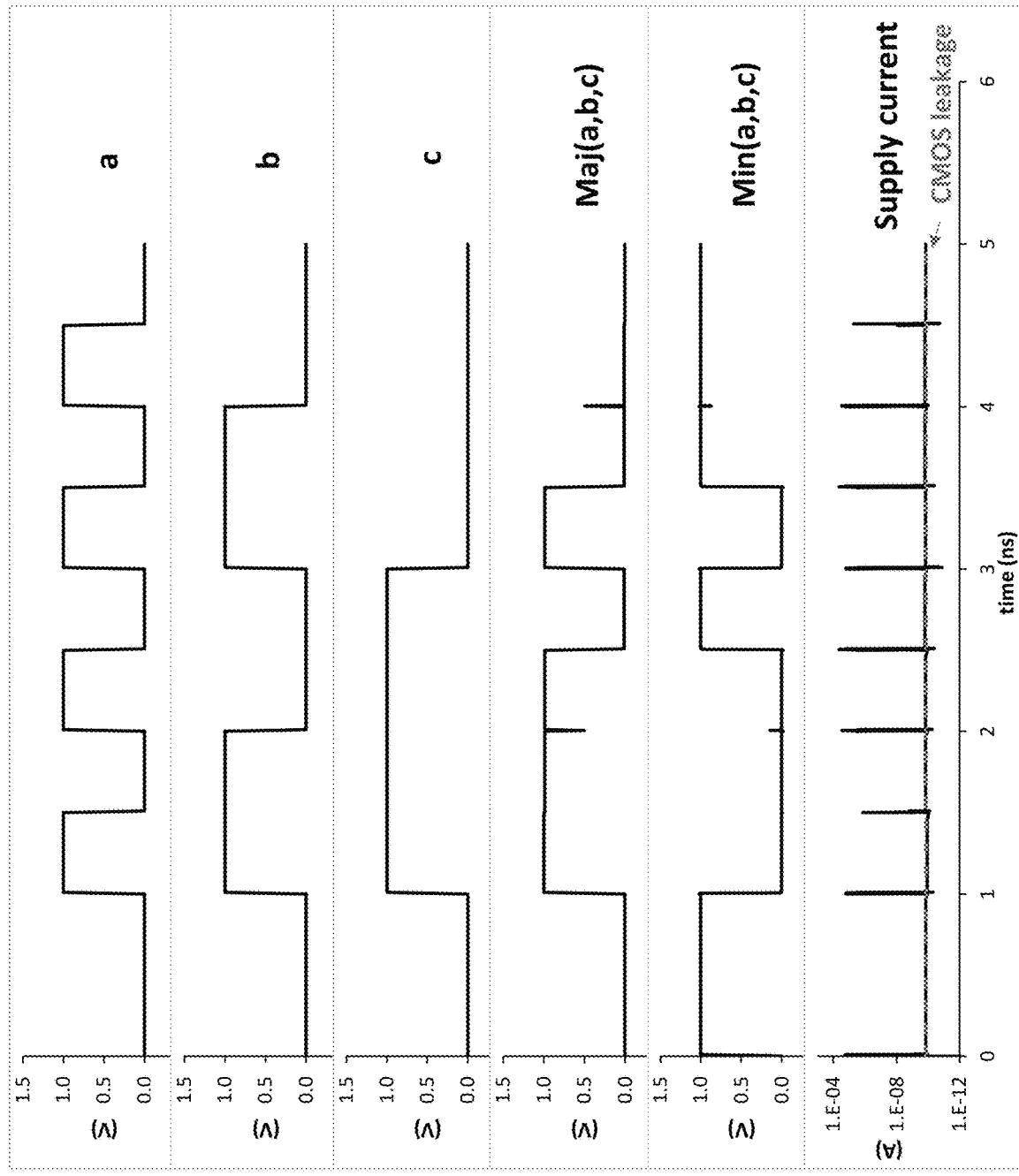
FIG. 6B illustrates a timing diagram from a 3-input majority gate or minority gate using paraelectric input capacitors, in accordance with some embodiments.

FIG. 6A illustrates timing diagram 600 for a 3-input majority or minority gate using ferroelectric input capacitors, in accordance with some embodiments. FIG. 6B illustrates timing diagram 620 from a 3-input majority gate or minority gate using paraelectric input capacitors, in accordance with some embodiments. In both cases, the voltage on node Vs shows a rail-to-rail voltage for majority function. Such rail-to-rail voltage suppresses crowbar current through driver circuitry 101. For some input combinations, using ferroelectric material can suppress leakage current below CMOS leakage level compared to using paraelectric material for the input capacitors.

Figure 7A:
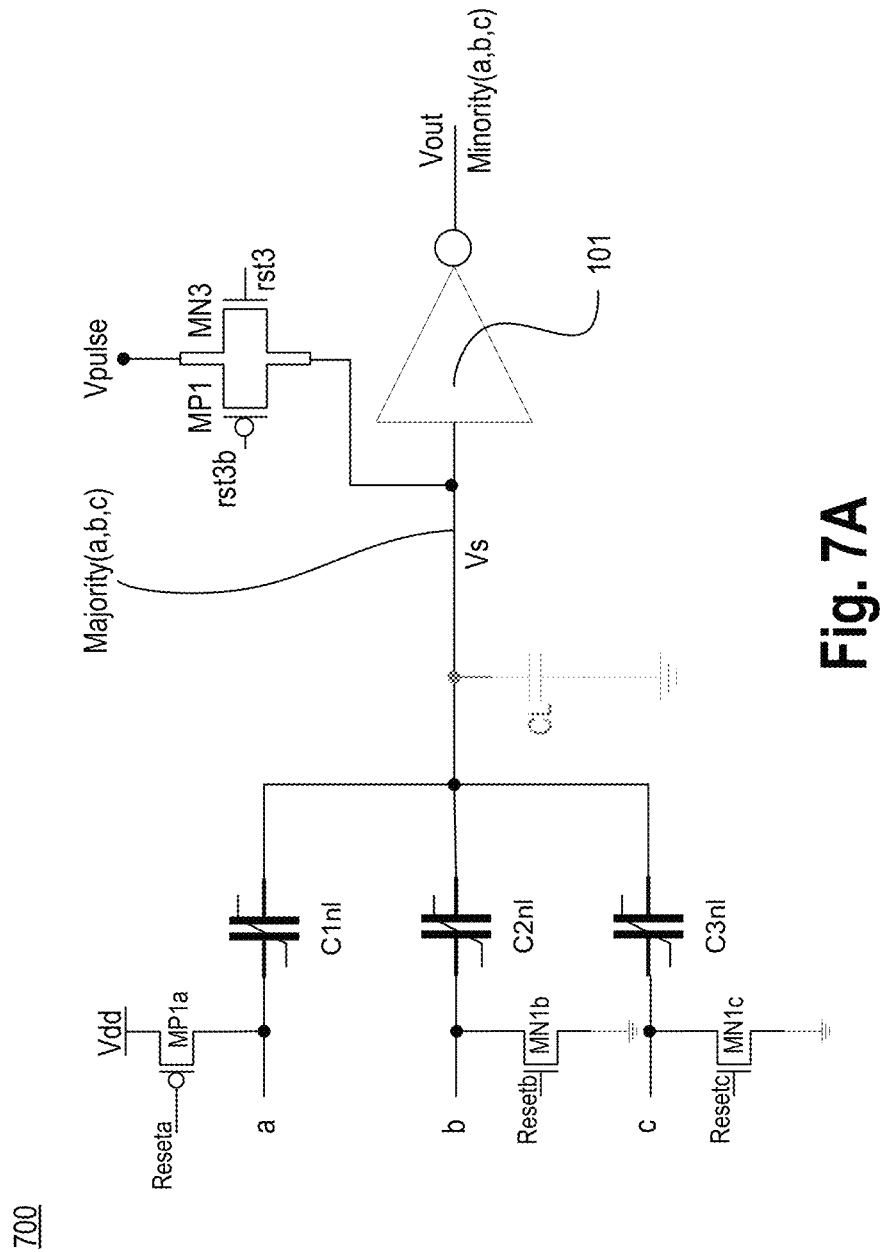
FIGS. 7A-B illustrate a local reset mechanism with pulsing scheme and associated timing diagram for a 3-input majority gate having ferroelectric input capacitors, in accordance with some embodiments.
Figure 7B:
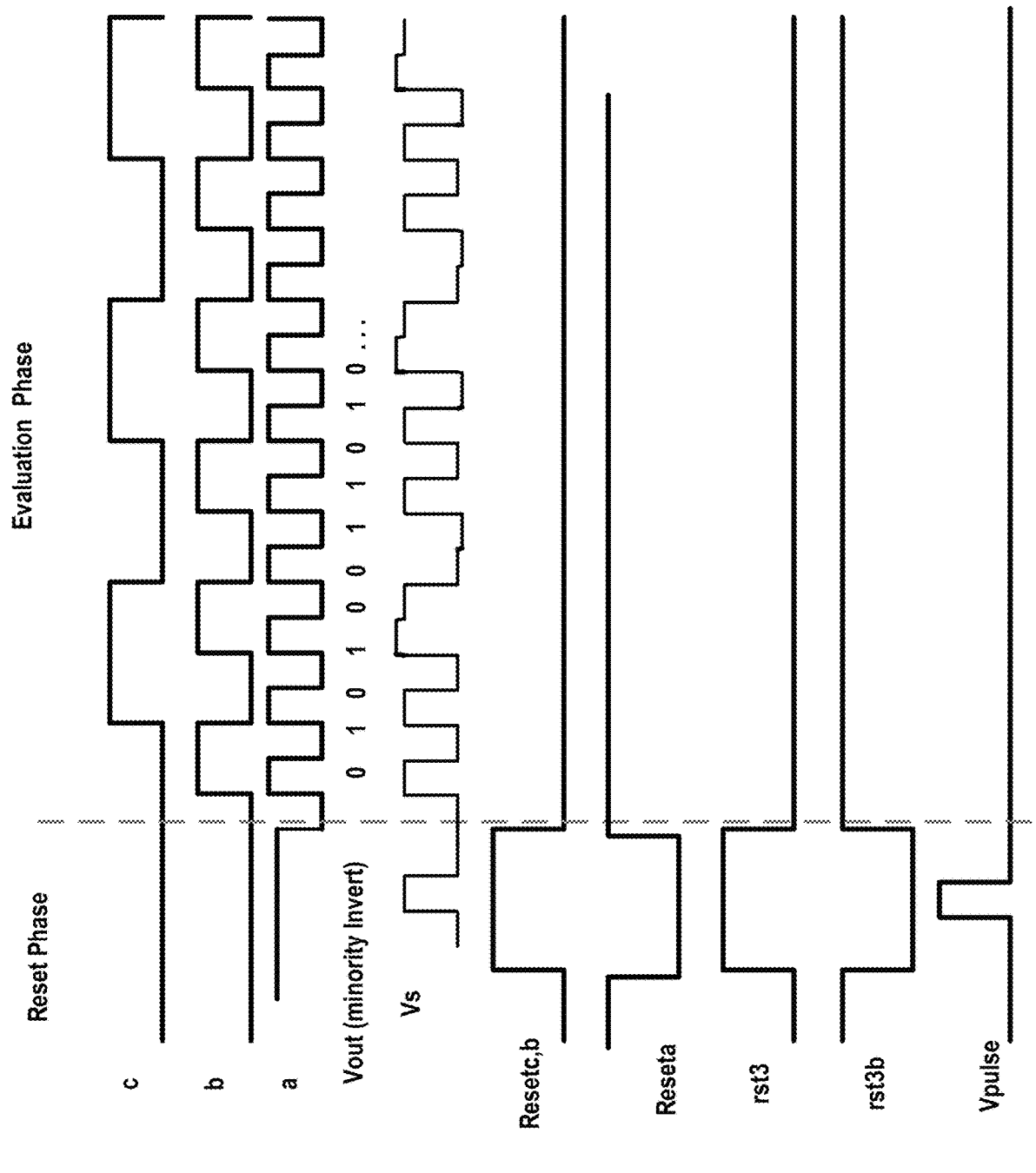

FIGS. 7A-B illustrate a local reset mechanism 500 with pulsing scheme and associated timing diagram 520 for a 3-input majority gate having ferroelectric input capacitors, in accordance with some embodiments. In some embodiments, inputs 'a', 'b', and 'c' are set to pre-determined voltages, and node Vs is set to a voltage using a pulse (Vpulse). In this case, inputs 'a', 'b', and 'c' are set such that one of these inputs is set to logic high (e.g., Vdd) and the other two inputs are set to logic low (e.g., ground). To achieve that, in some embodiments, input 'a' is coupled to a p-type transistor MP1a coupled to Vdd and controllable by Reseta, input 'b' is coupled to a n-type transistor MN1b coupled to Vss and controllable by Resetb, and input 'c' is coupled to a n-type transistor MN1c coupled to Vss and controllable by Resetc. For this 3-input majority gate, a bit pattern of "100" is applied to inputs 'a', 'b', and 'c', respectively, during a reset phase. For example, input 'a' is set to logic high '1', and inputs 'b' and 'c' are set to logic low '0' during the reset phase. During the reset phase, a pulse voltage is applied to node Vs through pass-gates MP1 and MN3, where MP1 is controlled by rst3b and MN3 is controlled by rst3, which is an inverse of rst3b. The voltage pulse is provided via Vpulse, which can be generated using any suitable circuitry (e.g., pulse generators). In various embodiments, the pulse width of Vpulse is shorter than the pulse widths of Reseta, Resetb, Resetc, rst3b, and rst3, and Vpulse is substantially in the middle of pulses Reseta, Resetb, Resetc, rst3b, and rst3. After pulses Reseta, Resetb, Resetc, rst3b, and rst3 end, the evaluation phase begins to complete the majority function of voltages on inputs 'a', 'b', and 'c'. The output voltage Vout (on node out) is discharged to a zero before the reset signals are de-asserted or asserted to ground, in accordance with some embodiments. While the embodiment here is illustrated for a 3-input majority gate, the same reset mechanism is applicable for majority gate of similar structure with different number of inputs.

In various embodiments, n/2−1 inputs are set to logic '1' and n/2+1 inputs are set to logic '0', where 'n' is a number. For a 5-input majority gate, the logic pattern applied to the inputs 'a', 'b', 'c', 'd', and 'e' is "11000", respectively. Likewise, for a 7-input majority gate, the logic pattern applied to the inputs 'a', 'b', 'c', 'd', 'e', 'f', and 'g' is "1110000", respectively. The order of the application of logic high and logic low voltage levels on the inputs can be modified so long as n/2−1 inputs are set to logic '1' and n/2+1 inputs are set to logic '0', where 'n' is a number. In various embodiments described herein, the voltage on node Vs is set to zero right before the evaluation phase. To do that n/2−1 inputs are set to logic '1' and n/2+1 inputs are set to logic '0', where 'n' is a number. However, the reverse is also possible. For example, the voltage on node Vs is set to high right before evaluation phase in which case n/2−1 inputs are set to logic '0' and n/2+1 inputs are set to logic '1', where 'n' is a number.

Figure 8A:
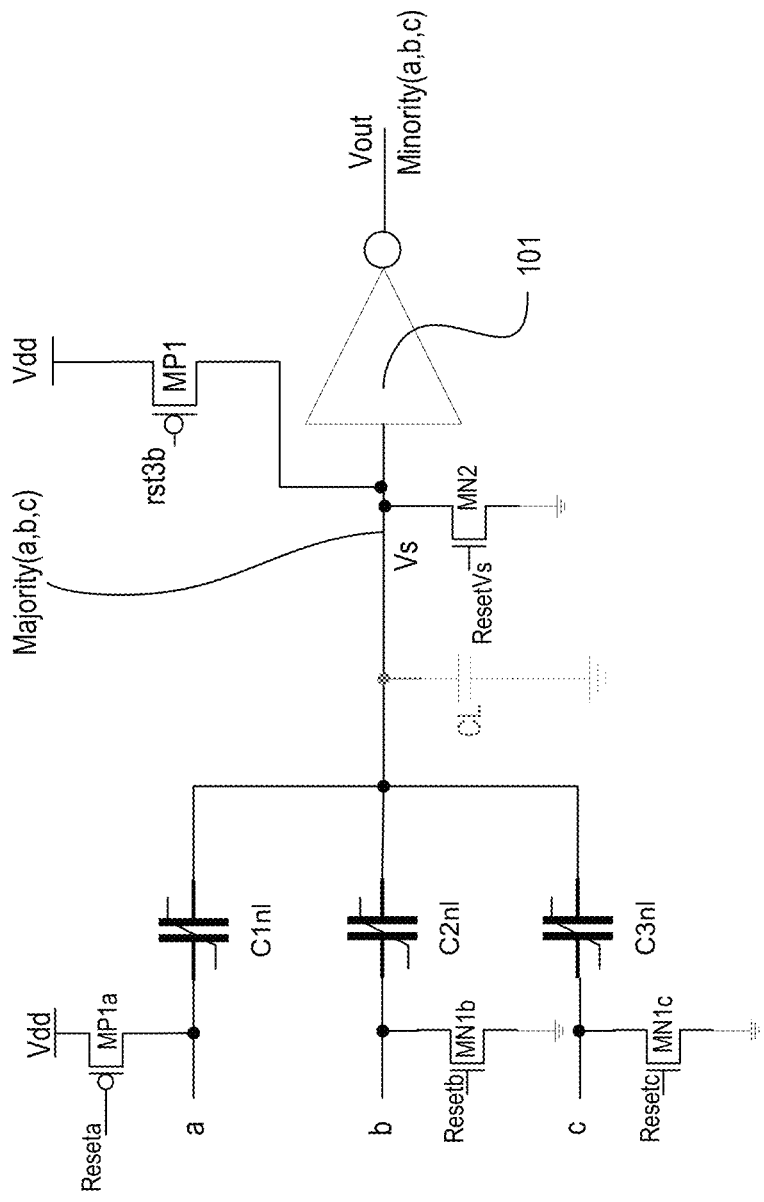
FIGS. 8A-B illustrate a local reset mechanism with a pull-up scheme and associated timing diagram for a 3-input majority gate having ferroelectric input capacitors, in accordance with some embodiments.
Figure 8B:
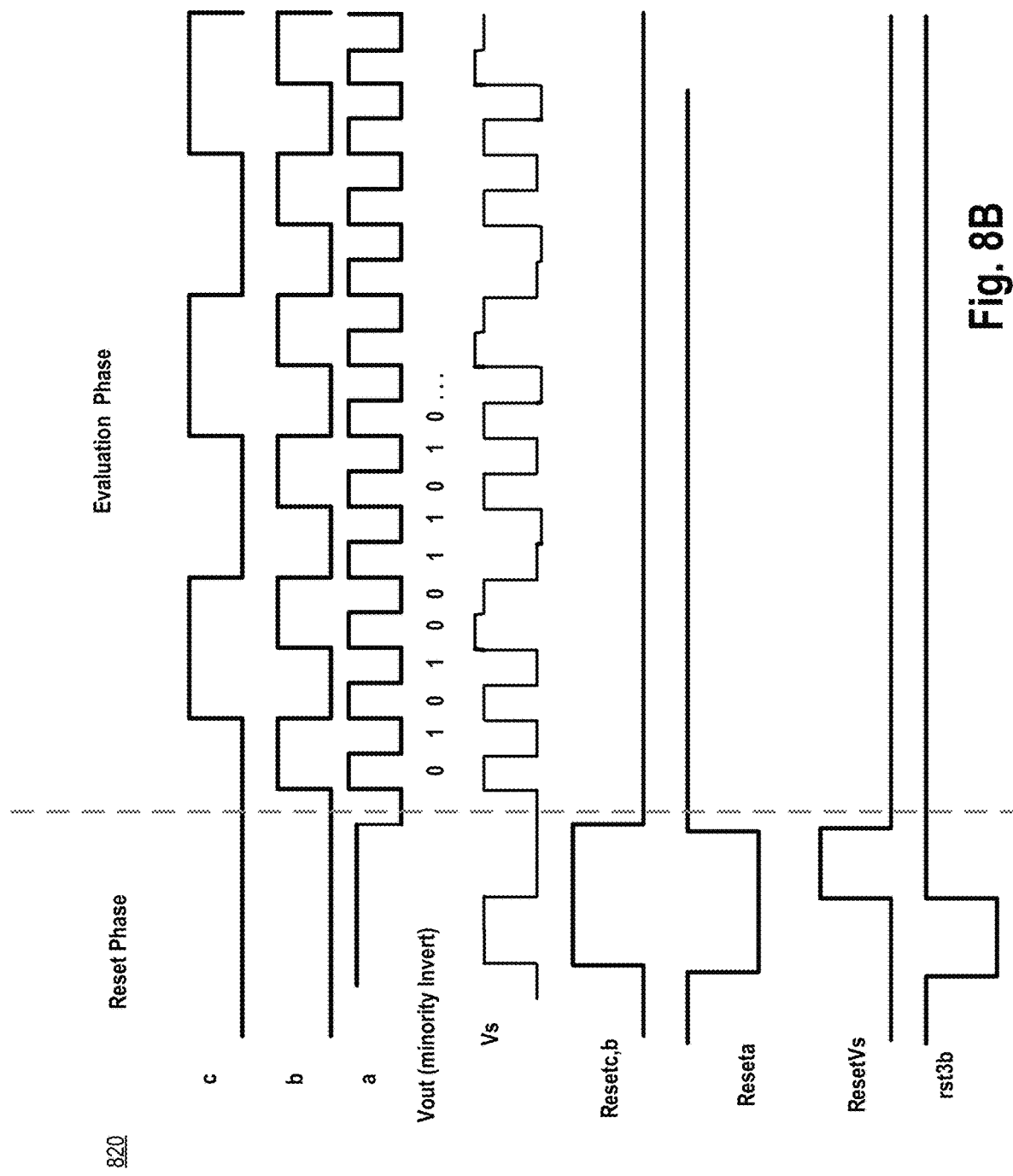

FIGS. 8A-B illustrate local reset mechanism 800 with a pull-up scheme and associated timing diagram 820 for a 3-input majority gate having ferroelectric input capacitors, in accordance with some embodiments. In some embodiments, inputs 'a', 'b', and 'c' are set to pre-determined voltages, and node Vs is set to a voltage using pull-up and pull-down devices. Compared to reset mechanism 700, pass-gate MP1 and MN3 are replaced with a pull-up device MP1 coupled to supply node Vdd and node Vs. In various embodiments, p-type pull-up device or transistor MP1 is controllable by rst3b. In some embodiments, reset mechanism 800 comprises pull-down device or transistor MN2 coupled to node Vs and ground. The input logic states to 'a', 'b', and 'c' during reset phase is the same as described with reference to reset mechanism 500. In various embodiments, the pull-up device MP1 pull-up the voltage on node Vs to Vdd during part of the reset phase, and during the remaining phase of the reset phase, the pull-down device MN2 discharges node Vs to ground. The embodiments of reset mechanisms 700 and 800 are applicable to the majority gate logic with FE based input capacitors.

Figure 9A:
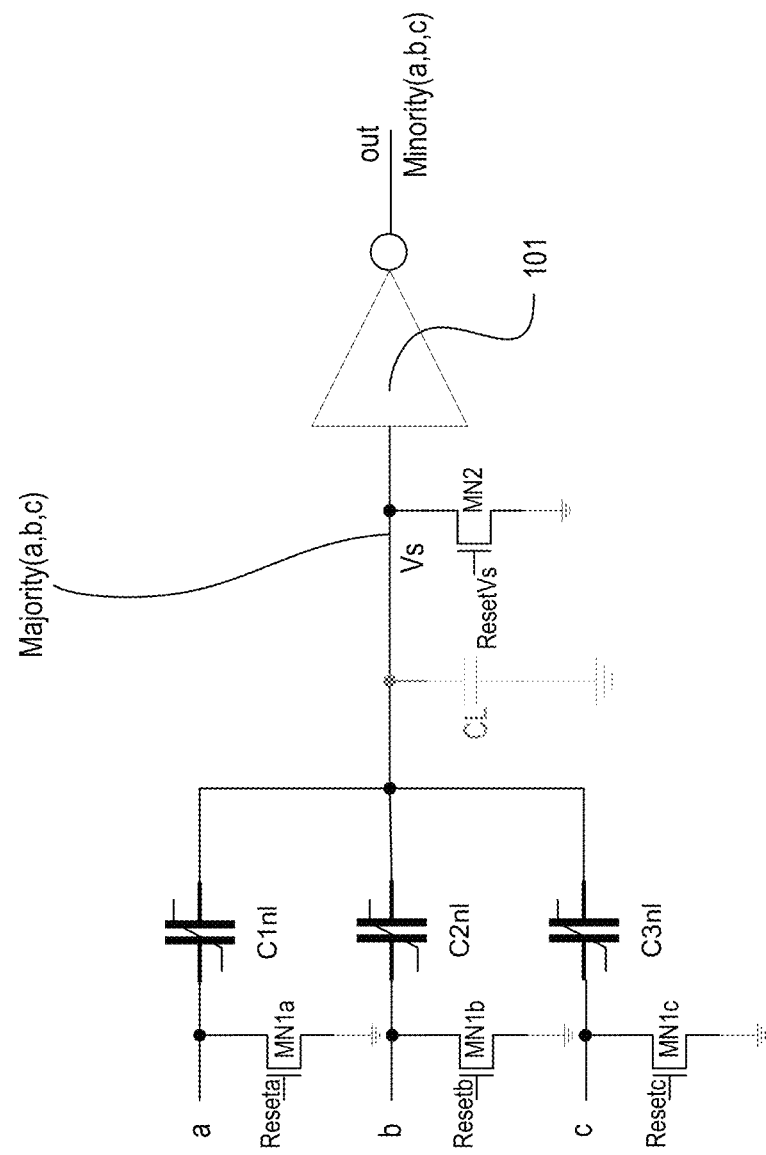
FIGS. 9A-B illustrate a local reset mechanism with a pull-down scheme and associated timing diagram for a 3-input majority gate having paraelectric input capacitors, in accordance with some embodiments.
Figure 9B:
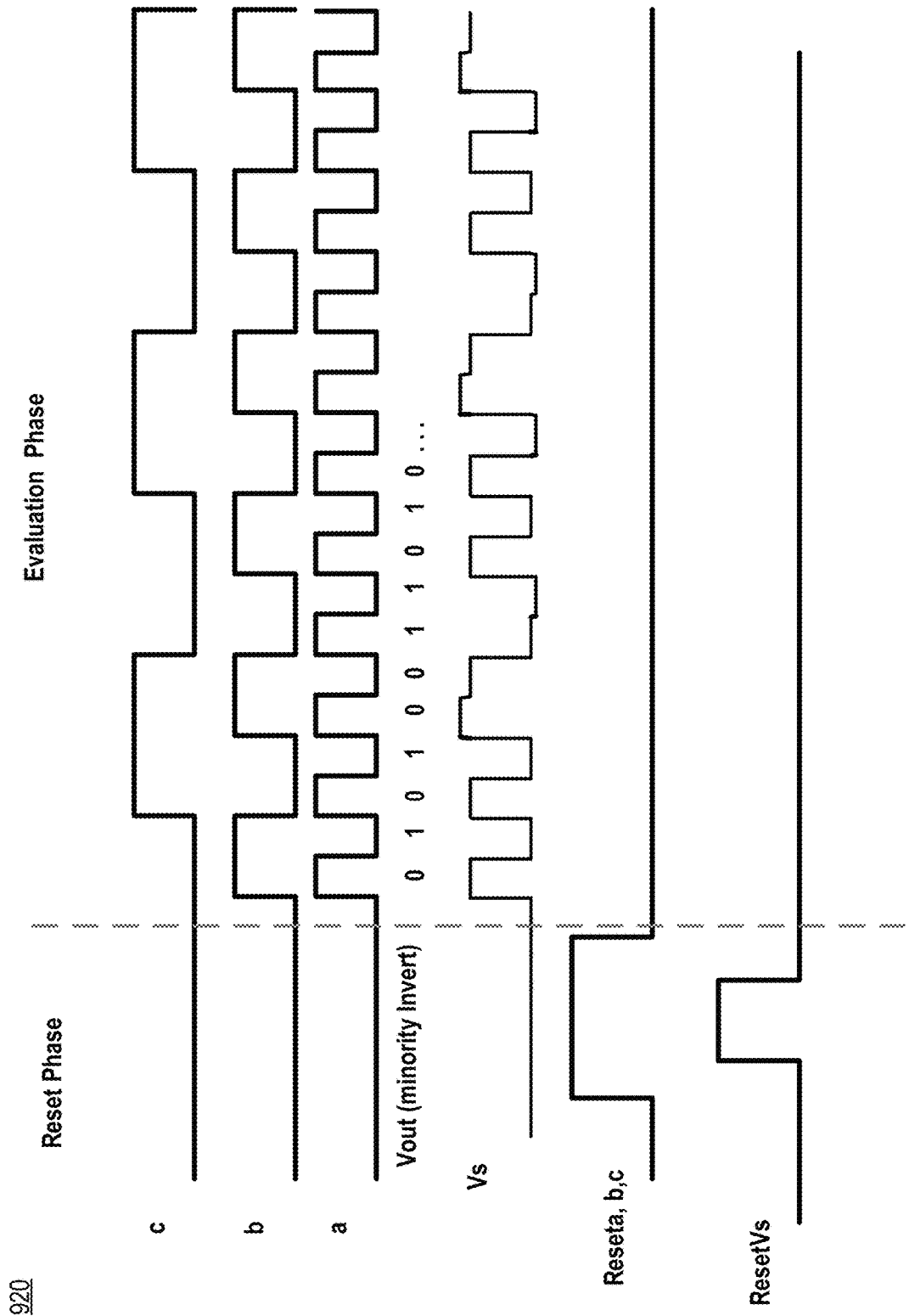

FIGS. 9A-B illustrate a local reset mechanism 900 with a pull-down scheme and associated timing diagram 920 for a 3-input majority gate having paraelectric input capacitors, in accordance with some embodiments. In some embodiments, inputs 'a', 'b', and 'c' are set to pre-determined voltages, and node Vs is set to a voltage using a pull-down device. In various embodiments, reset mechanism 900 is applicable to the majority gate logic with paraelectric (PE) based input capacitors. In this case, inputs 'a', 'b', and 'c' are set to logic low (e.g., Vss) during a reset phase. To achieve that, in some embodiments, input 'a' is coupled to a n-type transistor MN1*a* coupled to Vss and controllable by Reseta, input 'b' is coupled to a n-type transistor MN1*b* coupled to Vss and controllable by Resetb, and input 'c' is coupled to a n-type transistor MN1*c* coupled to Vss and controllable by Resetc. During the reset phase while the inputs are set to Vss, node Vs is discharged to ground by n-type transistor MN2 controllable by ResetVs. In various embodiments, the pulse width of ResetVs is smaller than the pulse widths of Reseta, Resetb, and Resetc.

In some embodiments, the reset mechanisms for both ferroelectric based input capacitors and paraelectric based input capacitors do not have pull-up and/or pull-down devices at the inputs (e.g., inputs 'a', 'b', and 'c'). In one such embodiment, the Vs node has a pull-down device to discharge the non-linear input capacitors to ground through a pull-down device.

Figure 10A:
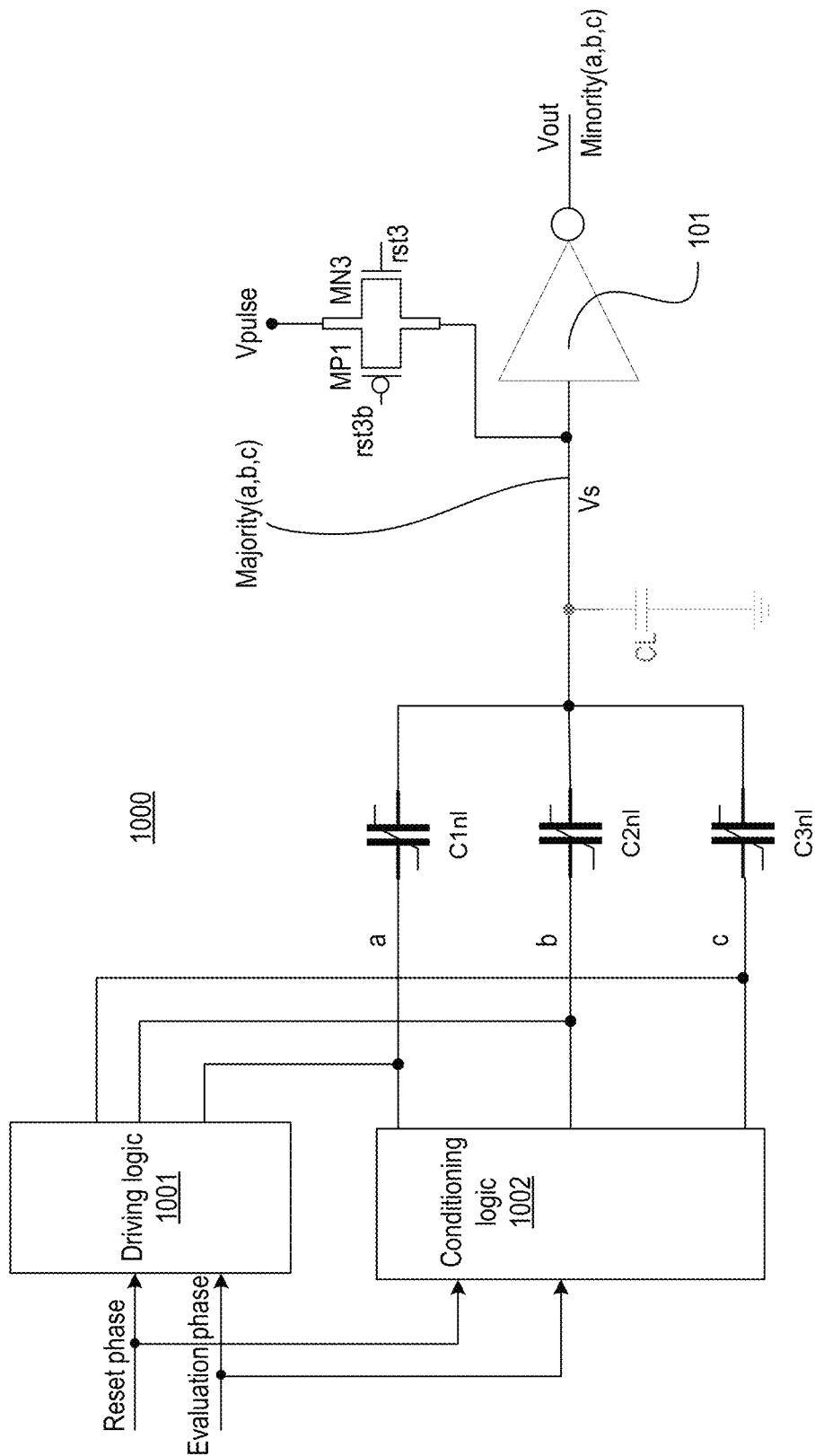
FIGS. 10A-B illustrate a conditioning mechanism with a pulsing scheme and associated timing diagram for a 3-input majority gate having ferroelectric input capacitors, in accordance with some embodiments.
Figure 10B:
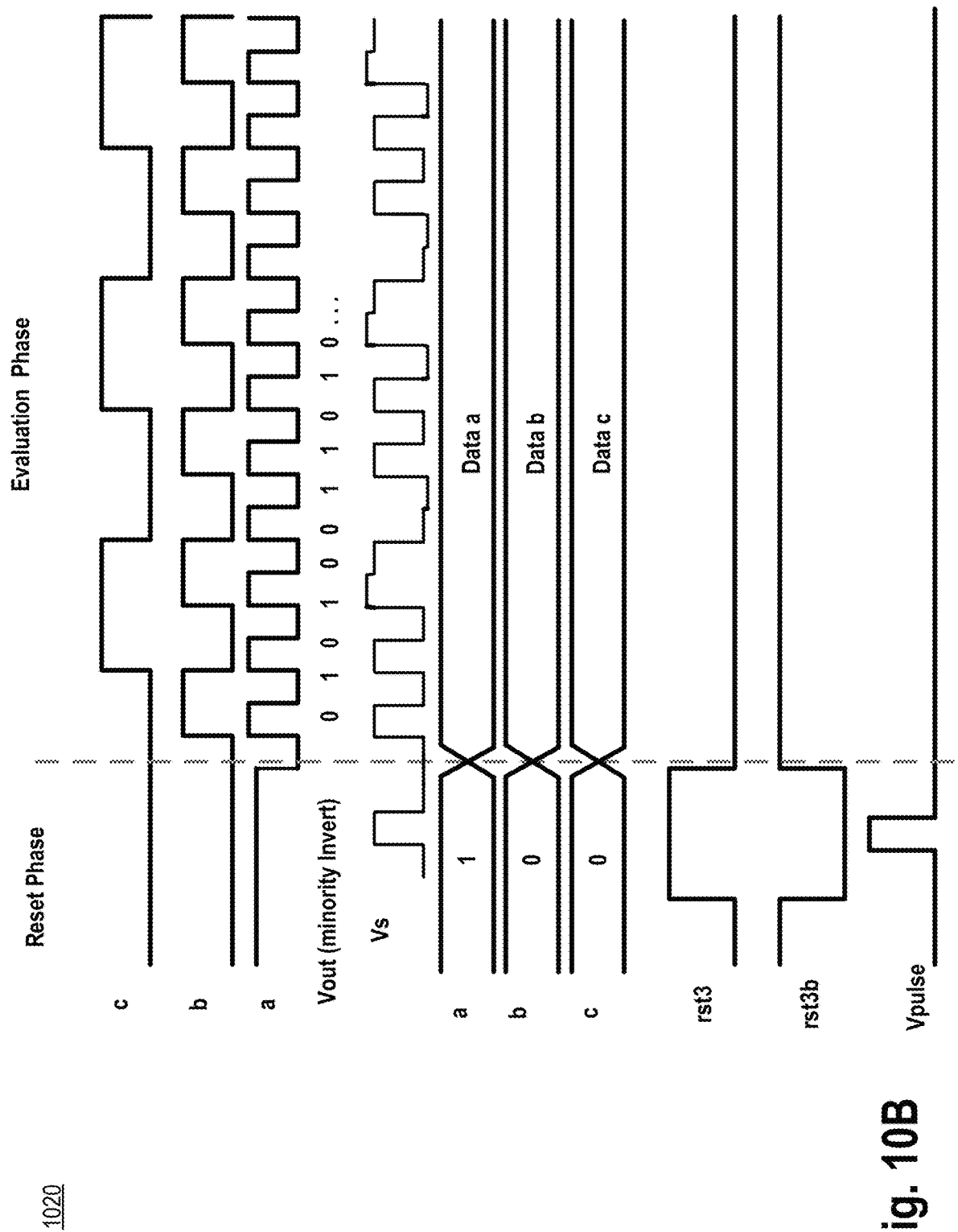

FIGS. 10A-B illustrate a conditioning mechanism 1000 with a pulsing scheme and associated timing diagram 1020 for a 3-input majority gate having ferroelectric input capacitors, in accordance with some embodiments. While various embodiments show pull-down and/or pull-down devices on the inputs (e.g., 'a', 'b', and 'c'), in some embodiments the inputs can be pre-conditioned for reset purposes. For example, a processor architecture can generate input signals for a reset phase to condition inputs of the majority (or minority) logic gate. In one such example, pull-down and/or pull-up devices at the majority (or minority) logic gate inputs can be removed because the input nodes are pre-conditioned for reset. During the evaluation phase, normal data is allowed to arrive at the inputs of the majority (or minority) logic gate. During the evaluation phase the pre-conditioning of inputs is disabled.

In some embodiments, inputs 'a', 'b', and 'c' are set to pre-condition voltages during a reset phase, and node Vs is set to a voltage using a pulse (Vpulse) during the reset phase. Here, the non-linear input capacitors are ferroelectric capacitors. The reset mechanism 1000 comprises tri-stateable driving logic 1001, conditioning logic 1002, and pulse injection circuitry comprising pass-gate MP1 and MN3. Here, inputs 'a', 'b', and 'c' are set or conditioned by conditioning logic or circuitry 1002 such that one of these inputs is set to logic high (e.g., Vdd) and the other two inputs are set to logic low (e.g., ground) during the reset phase. For this 3-input majority gate, a bit pattern of "100" is applied to inputs 'a', 'b', and 'c', respectively, during the reset phase by conditioning logic 1002. For example, input 'a' is set to logic high '1', and inputs 'b' and 'c' are set to logic low '0' during the reset phase. During the reset phase, a pulse voltage is applied to node Vs through pass-gates MP1 and MN3, where MP1 is controlled by rst3*b* and MN3 is controlled by rst3, which is an inverse of rst3*b*. The voltage pulse is provided via Vpulse, which can be generated using any suitable circuitry (e.g., pulse generators). In some embodiments, Vpulse has pulse width which is shorter in duration than the reset phase. In some embodiments, the pulse width of Vpulse arrives after the reset phase begins and after the inputs are provided conditioned logic values at the input terminals of the non-linear capacitors.

After conditioning of inputs 'a', 'b', and 'c', and pulses for rst3*b*, and rst3 end, the evaluation phase begins to complete the majority function of voltages on inputs 'a', 'b', and 'c'. During evaluation phase, driving logic 1001 no longer tri-states the drivers that drive to nodes 'a', 'b', and 'c'. During the evaluation phase, conditioning logic 1002 is disabled, in accordance with some embodiments. The output voltage Vout (on node out) is discharged to zero before the conditioning circuitry 1002 is disabled, in accordance with some embodiments. While the embodiment here is illustrated for a 3-input majority gate, the same reset mechanism is applicable for majority gate of similar structure with different number of inputs.

In various embodiments, n/2−1 inputs are set to logic '1' and n/2+1 inputs are conditioned by conditioning circuitry 1002 to logic '0', where 'n' is a number. For a 5-input majority gate, the logic pattern applied to the inputs 'a', 'b', 'c', 'd', and 'e' by conditioning circuitry 1002 is "11000", respectively. Likewise, for a 7-input majority gate, the logic pattern applied to the inputs 'a', 'b', 'c', 'd', 'e', T, and 'g' by conditioning circuitry 1002 is "1110000", respectively. The order of the application of logic high and logic low voltage levels by conditioning circuitry 1002 on the inputs can be modified so long as n/2−1 inputs are set to logic '1' and n/2+1 inputs are set to logic '0', where 'n' is a number. In various embodiments described herein, the voltage on node Vs is set to zero right before the evaluation phase. To do that, n/2−1 inputs are conditioned by conditioning circuitry 1002 to logic '1' and n/2+1 inputs are set to logic '0', where 'n' is a number. However, the reverse is also possible. For example, the voltage on node Vs is set to high right before the evaluation phase in which case n/2−1 inputs are conditioned by conditioning circuitry 1002 to logic '0' and n/2+1 inputs are set to logic '1', where 'n' is a number.

Figure 11A:
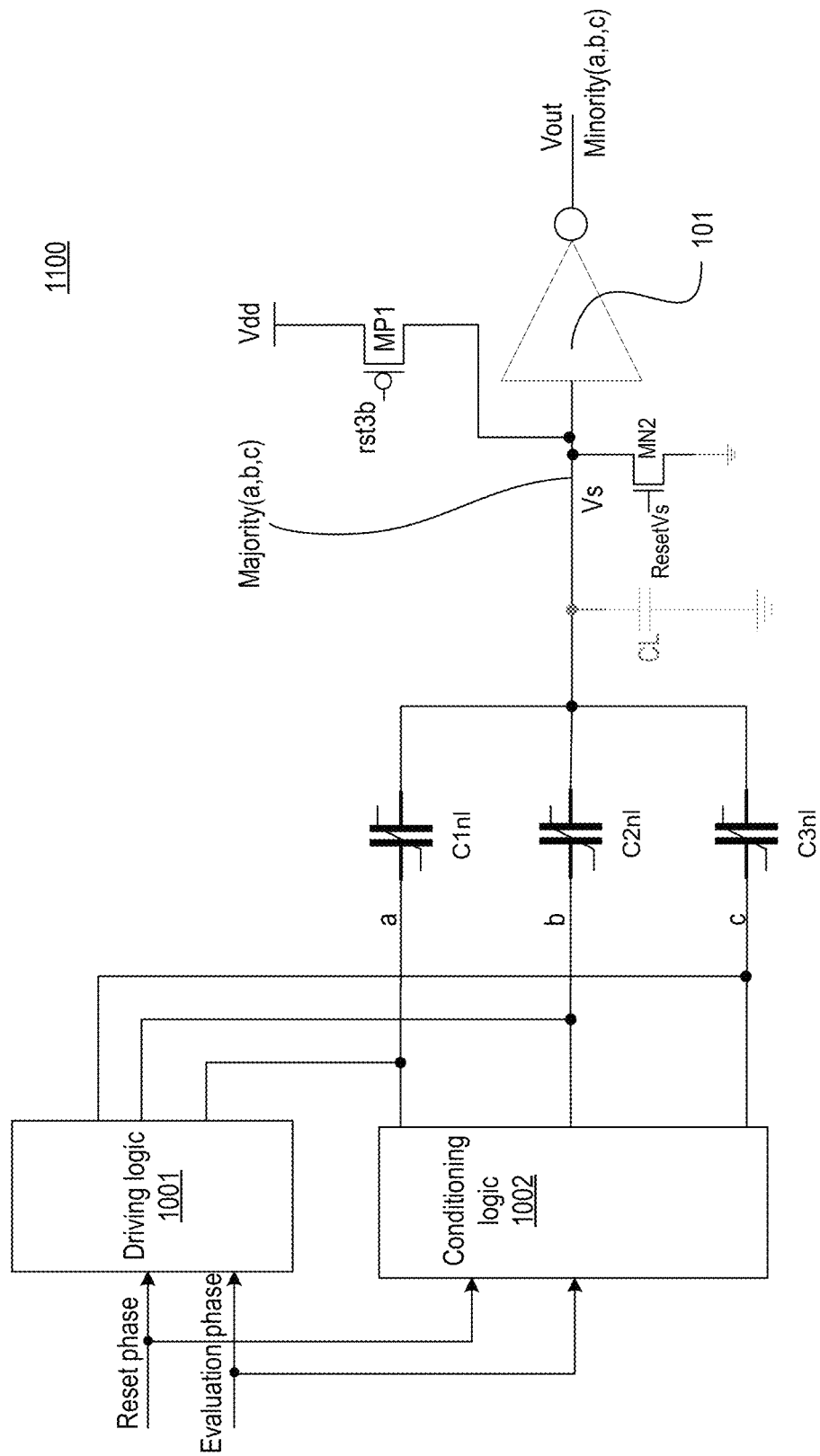
FIGS. 11A-B illustrate a conditioning mechanism with a pull-up scheme and associated timing diagram for a 3-input majority gate having ferroelectric input capacitors, in accordance with some embodiments.
Figure 11B:
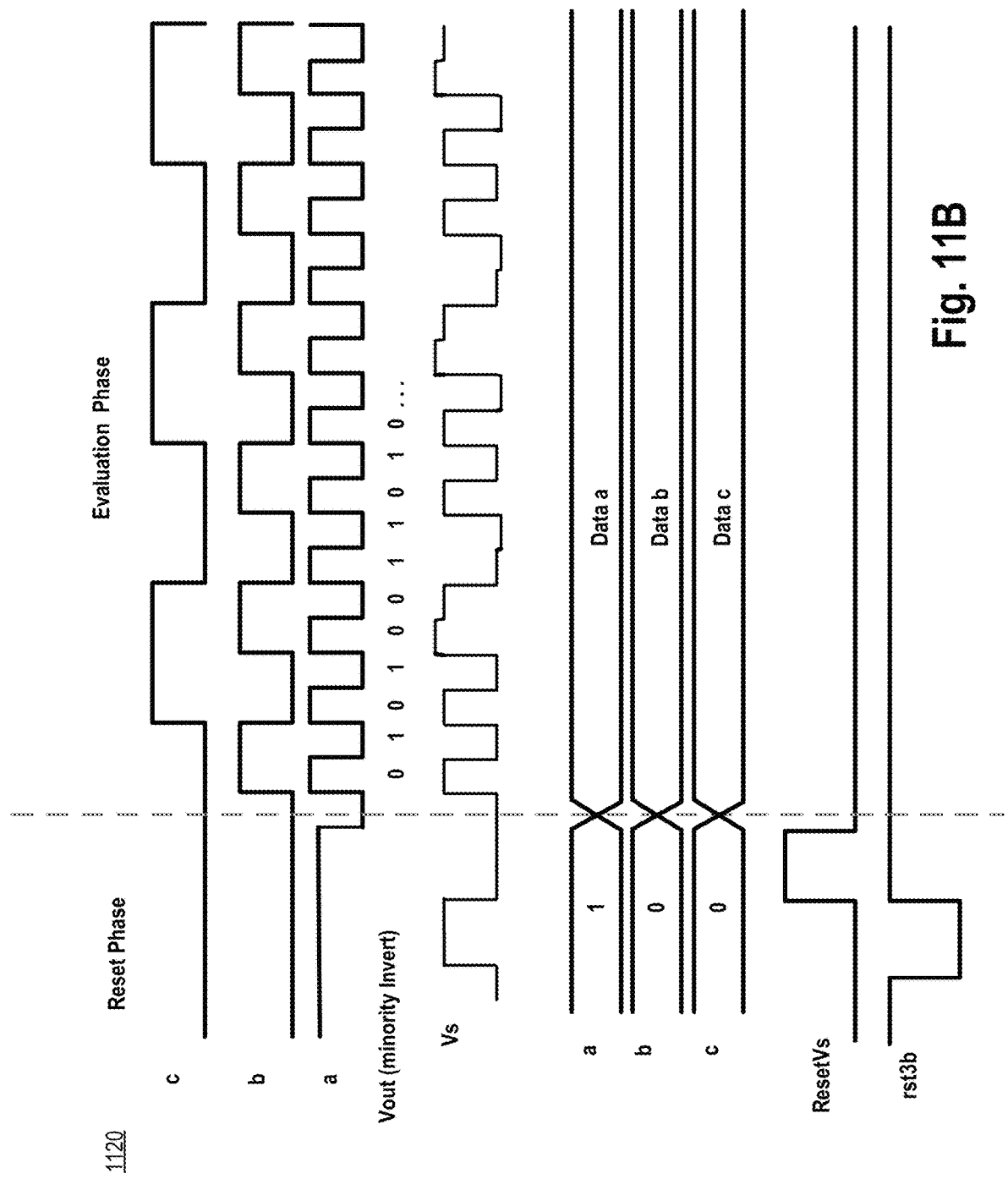

FIGS. 11A-B illustrate a conditioning mechanism 1100 with a pull-up scheme and associated timing diagram 1120 for a 3-input majority gate having ferroelectric input capacitors, in accordance with some embodiments. In some embodiments, inputs 'a', 'b', and 'c' are set to pre-determined voltages, and node Vs is set to a voltage using pull-up and pull-down devices. Here, the non-linear input capacitors are ferroelectric capacitors. Compared to reset mechanism 1000, pass-gates MP1 and MN3 are replaced with a pull-up device MP1 coupled to supply node Vdd and node Vs. In various embodiments, p-type pull-up device or transistor MP1 is controllable by rst3*b*. In some embodiments, reset mechanism 1100 comprises pull-down device or transistor MN2 coupled to node Vs and ground. The input logic states to 'a', 'b', and 'c' during reset phase is the same as described with reference to reset mechanism 1000. In various embodiments, the pull-up device MP1 pull-up the voltage on node Vs to Vdd during part of the reset phase, and during the remaining phase of the reset phase, the pull-down device MN2 discharges node Vs to ground. The embodiments of reset mechanisms 1000 and 1100 are applicable to the majority gate logic with FE based input capacitors.

Figure 12A:
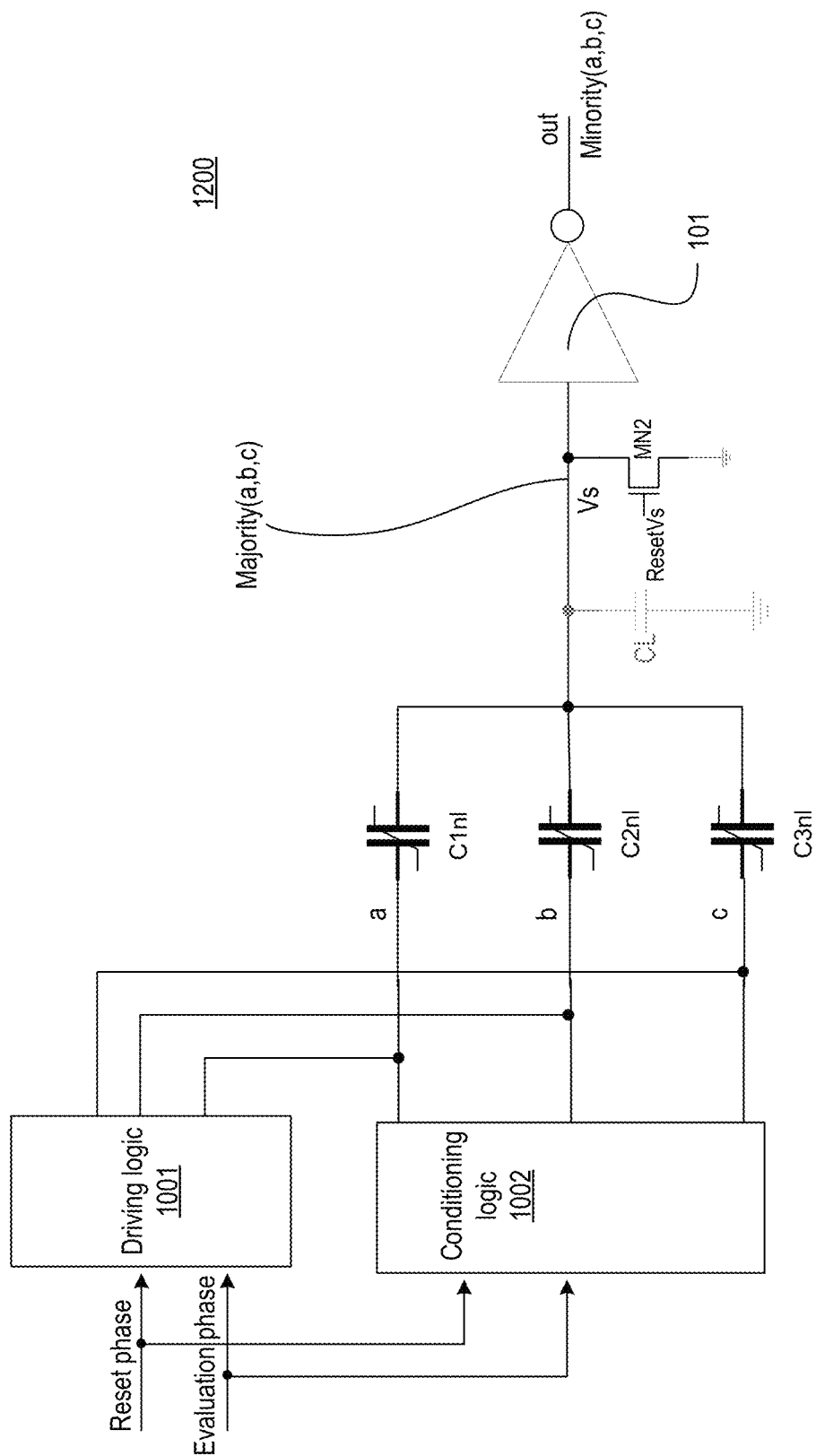

FIGS. 12A-B illustrate a conditioning mechanism 1200 with a pull-down scheme and associated timing diagram 1220 for a 3-input majority gate having paraelectric input capacitors, in accordance with some embodiments. In some embodiments, inputs 'a', 'b', and 'c' are set to pre-determined voltages, and node Vs is set to a voltage using a pull-down device. In various embodiments, reset mechanism 1200 is applicable to the majority gate logic with paraelectric (PE) based input capacitors. In this case, inputs 'a', 'b', and 'c' are set to logic low (e.g., Vss) during a reset phase by conditioning circuitry 1002. During the reset phase while the inputs are conditioned to Vss, node Vs is discharged to ground by n-type transistor MN2 controllable by ResetVs. During evaluation phase, driving logic 1001 no longer tri-states the drivers that drive to nodes 'a', 'b', and 'c'. During the evaluation phase, conditioning logic 1002 is disabled, in accordance with some embodiments. The output voltage Vout (on node out) is discharged to a zero before the conditioning circuitry 1002 is disabled, in accordance with some embodiments. While the embodiment here is illustrated for a 3-input majority gate, the same reset mechanism is applicable for majority gate of similar structure with different number of inputs. Although the embodiments show driving circuitry 1001 and conditioning circuitry 1002 as separate circuitries, they can be combined in one logic circuitry. In one such embodiment, an inverter driving out a signal can be converted as NAND/NOR gate instead to condition the output correctly for the input terminals of the non-linear capacitors.

Figure 13:
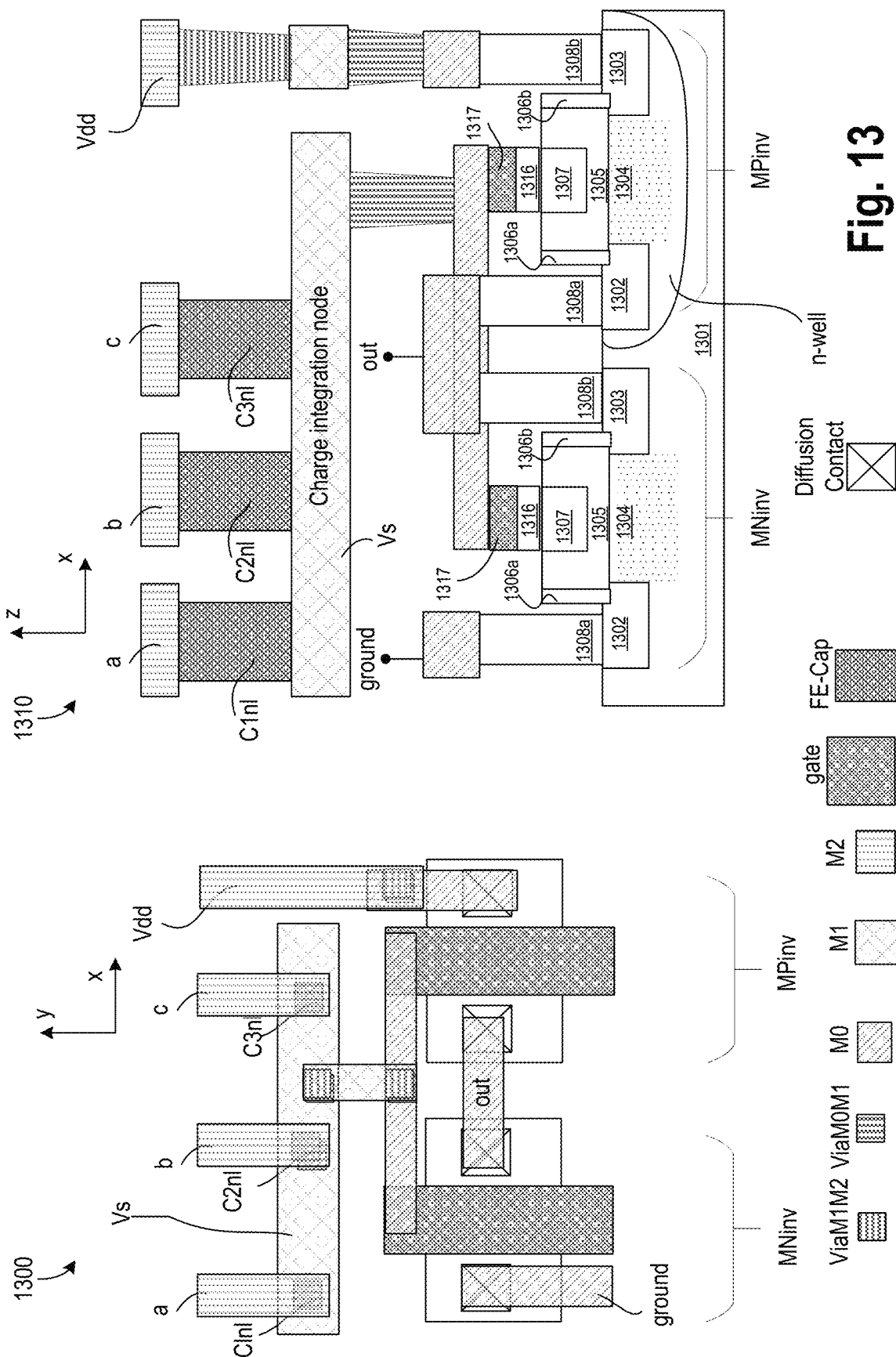
FIG. 13 illustrates top down layout and corresponding cross-section of a 3-input majority gate, respectively, in accordance with some embodiments.

FIG. 13 illustrates top down layout and corresponding cross-section of a 3-input majority gate, respectively, in accordance with some embodiments. Layout 1300 illustrates a compact layout of 3-input majority gate of FIG. 4 with a pitch of two minimum sized transistors MNinv and MPinv of inverter 101. In some embodiments, non-linear input capacitors C1$n$1, C2$n$1, and C3$n$1 are positioned in the same set of layers. For example, non-linear capacitors C1$n$1, C2$n$1, and C3$n$1 are positioned in the place of via for metal layer 1 (M1) to metal layer 2 (M2).

In some embodiments, transistors MNinv and MPinv are fabricated in the frontend of the die. Inputs a, b, and c are on M2. Common node Vs (also referred to as charge integration layer or node) is on M1. The common node Vs1 is shared by non-linear capacitors (C1$n$1, C2$n$1, and C3$n$1) and/or non-linear polar capacitor 105. While non-linear capacitors C1$n$1, C2$n$1, and C3$n$1 are positioned in location of M1-via-M2, they can be further located in the backend of the die. For example, non-linear capacitors C1$n$1, C2$n$1, and C3$n$1, can be positioned in M4-Via-M5 or higher. As such, lower metal layers are freed up for routing of other signals.

Transistors MNinv and MPinv can be planar or non-planar transistors. In some embodiments, transistors MNinv and MPinv can be formed in the frontend or backend. In some embodiments, MNinv and MPinv are stacked transistors. In some embodiments, one or more of non-linear capacitors C1$n$1, C2$n$1, and C3$n$1, are formed in the frontend or backend. The transistors here can be Square Wire, Rectangular Ribbon Transistors, Gate All Around Cylindrical Transistors, Tunneling FETs ferroelectric FETs (FeFETs), bi-polar transistors (BJT), BiCMOS, or other devices implementing transistors functionality, for instance, carbon nanotubes or spintronic devices. In some embodiments, the transistors are typical metal oxide semiconductor (MOS) transistors or their derivative including Tri-Gate and FinFET transistors. While MOSFET have symmetrical source and drain terminals, TFET device has asymmetric source and drain terminals.

Transistors MNinv and MPinv are formed in/on substrate 1301, and comprises respective source 1302, drain 1303, channel region 1304, source contact 1308$a$, drain contact 1308$b$, and gate comprising gate dielectric 1305, gate liners 1306$a$ and 1306$b$; gate metal 1307.

Substrate 1301 includes a suitable semiconductor material such as: single crystal silicon, polycrystalline silicon and silicon on insulator (SOI). In one embodiment, substrate 1301 includes other semiconductor materials such as: Si, Ge, SiGe, or a suitable group III-V or group III-N compound. Substrate 1301 may also include semiconductor materials, metals, dopants, and other materials commonly found in semiconductor substrates.

In some embodiments, source region 1302 and drain region 1303 for each transistor are formed within substrate 1301 adjacent to the gate stack of the transistor. In various embodiments, p-type transistors MPinv is formed in an n-well, which is in substrate 1301. The source region 1302 and drain region 1303 are generally formed using either an etching/deposition process or an implantation/diffusion process.

In the etching and/or deposition process, substrate 1301 may first be etched to form recesses at the locations of the source 1302 and drain 1303 regions. An epitaxial deposition process may then be carried out to fill the recesses with material that is used to fabricate the source region 1302 and drain region 1303. In the implantation/diffusion process, dopants such as boron, aluminum, antimony, phosphorous, or arsenic may be ion-implanted into the substrate to form the source region 1302 and drain region 1303. An annealing process that activates the dopants and causes them to diffuse further into substrate 1301 typically follows the ion-implantation process.

In some embodiments, one or more layers of metal and/or metal alloys are used to form the source region 1302 and drain region 1303. In some embodiments, source region 1302 and drain region 1303 are formed using one or more alternate semiconductor materials such as germanium or a suitable group III-V compound. In some embodiments, source region 1302 and drain region 1303 are fabricated using a silicon alloy such as silicon germanium or silicon carbide. In some embodiments, the epitaxially deposited silicon alloy is doped in-situ with dopants such as boron, arsenic, or phosphorous.

The semiconductor material for channel region 1304 may have the same material as substrate 1301 or n-well for a p-type transistor MPinv, in accordance with some embodiments. In some embodiments, channel region 604 includes one of: Si, SiGe, Ge, and GaAs.

The gate dielectric layer 1305 may include one layer or a stack of layers. The one or more layers may include high-k dielectric material, silicon oxide, and/or silicon dioxide ($SiO_2$). The high-k dielectric material may include elements such as: zinc, niobium, scandium, lean yttrium, hafnium, silicon, strontium, oxygen, barium, titanium, zirconium, tantalum, aluminum, and lanthanum. Examples of high-k materials that may be used in the gate dielectric layer include: lead zinc niobate, hafnium oxide, lead scandium tantalum oxide, hafnium silicon oxide, yttrium oxide, aluminum oxide, lanthanum oxide, barium strontium titanium oxide, lanthanum aluminum oxide, titanium oxide, zirconium oxide, tantalum oxide, and zirconium silicon oxide. In some embodiments, when a high-k material is used, an annealing process is used on the gate dielectric layer 1305 to improve its quality.

In some embodiments, a pair of liner layers (sidewall liners) 606$a/b$ are formed on opposing sides of the gate stack that bracket the gate stack. The pair of liner layers 1306$a/b$ are formed from a material such as: silicon oxynitride, silicon nitride, silicon nitride doped with carbon, or silicon carbide. Processes for forming sidewall liners are well-known in the art and generally include deposition and etching process operations. In some embodiments, a plurality of liner pairs may be used. For example, two pairs, three pairs, or four pairs of sidewall liners may be formed on opposing sides of the gate stack.

Gate metal layer 1307 may comprise at least one P-type work-function metal or N-type work-function metal, depending on whether the transistor is to be a p-type or an n-type transistor. Gate metal layer 1307 may comprise a stack of two or more metal layers, where one or more metal layers are work-function metal layers and at least one metal layer is a conductive fill layer.

For an n-type transistor, metals that may be used for the gate metal layer 1307 include: aluminum carbide, tantalum carbide, zirconium carbide, and hafnium carbide. In some embodiments, metal for gate metal layer 1307 for n-type transistor include: aluminum, hafnium, zirconium, titanium, tantalum, and their alloys. An n-type metal layer will enable the formation of an n-type gate metal layer 1307 with a work function that is between about 3.9 eV and about 4.2 eV. In some embodiments, metal of layer 1307 includes one of: TiN, TiSiN, TaN, Cu, Al, Au, W, TiSiN, or Co. In some embodiments, metal of layer 107 includes one or more of: Ti, N, Si, Ta, Cu, Al, Au, W, or Co.

For a p-type transistor, metals that are used for gate metal layer 1307 include, but are not limited to, ruthenium, palladium, platinum, cobalt, nickel, and conductive metal oxides. An example of conductive oxide includes ruthenium oxide. A p-type metal layer will enable the formation of a p-type gate metal layer 1307 with a work function that is between about 4.9 eV and about 5.2 eV.

Any suitable material can be used for drain and source contacts 1308*a/b* and via 1309*a/b*. For example, one or more of Ti, N, Si, Ta, Cu, Al, Au, W, or Co can be used for drain and source contacts 1308*a/b* and via 1309*a/b*. The gate electrodes 1307 may be connected to one another directly or through vias and metal layers. Drivers (not shown) drive signals on nodes a, b, and c. The gates 1307 of MPinv and MNinv are coupled together. For example, gate electrodes 1307 may be connected to node Vs directly or through vias and metal layers 1316 and 1317, respectively.

Figure 14:
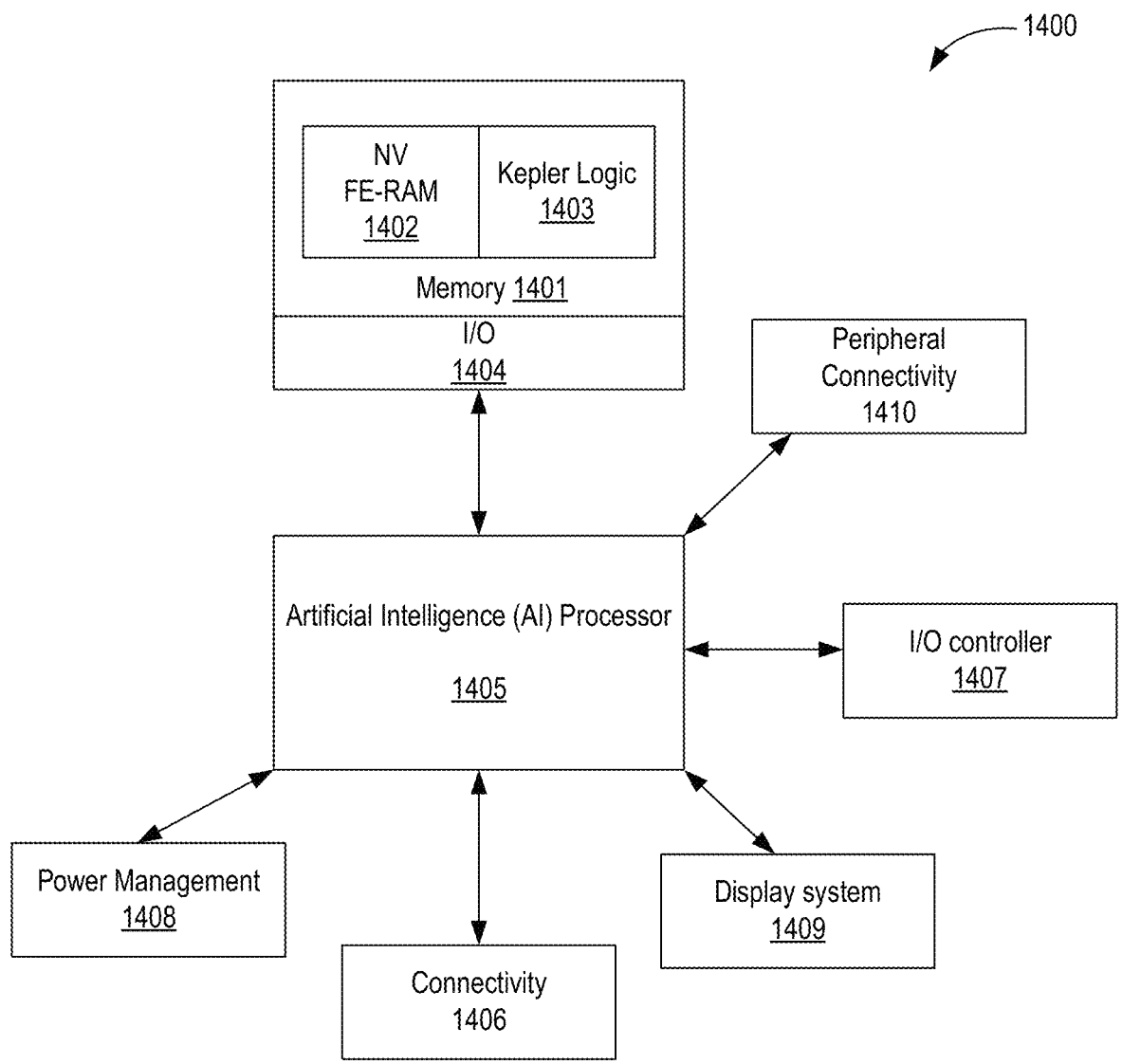
FIG. 14 illustrates a system-on-chip (SOC) that uses the majority logic gates having non-linear input capacitors and with conditioning or reset schemes, in accordance with some embodiments.

FIG. 14 illustrates a system-on-chip (SOC) 1400 that uses the majority logic gates having non-linear input capacitors with conditioning and/or reset schemes, in accordance with some embodiments. SOC 1400 comprises memory 1401 having static random-access memory (SRAM) or FE based random access memory FE-RAM, or any other suitable memory. The memory can be non-volatile (NV) or volatile memory. Memory 1401 may also comprise logic 1403 to control memory 1402. For example, write and read drivers are part of logic 1403. These drivers and other logic are implemented using the majority or threshold gates of various embodiments. The logic can comprise majority or threshold gates and traditional logic (e.g., CMOS based NAND, NOR etc.).

SOC further comprises a memory I/O (input-output) interface 1404. The interface may be double-data rate (DDR) compliant interface or any other suitable interface to communicate with a processor. Processor 1405 of SOC 1400 can be a single core or multiple core processor. Processor 1405 can be a general-purpose processor (CPU), a digital signal processor (DSP), or an Application Specific Integrated Circuit (ASIC) processor. In some embodiments, processor 1405 is an artificial intelligence (AI) processor (e.g., a dedicated AI processor, a graphics processor configured as an AI processor). In various embodiments, processor 1405 is a processor circuitry which is to execute one or more instructions.

AI is a broad area of hardware and software computations where data is analyzed, classified, and then a decision is made regarding the data. For example, a model describing classification of data for a certain property or properties is trained over time with large amounts of data. The process of training a model requires large amounts of data and processing power to analyze the data. When a model is trained, weights or weight factors are modified based on outputs of the model. Once weights for a model are computed to a high confidence level (e.g., 95% or more) by repeatedly analyzing data and modifying weights to get the expected results, the model is deemed "trained." This trained model with fixed weights is then used to make decisions about new data. Training a model and then applying the trained model for new data is hardware intensive activity. In some embodiments, AI processor 405 has reduced latency of computing the training model and using the training model, which reduces the power consumption of such AI processor systems.

Processor 1405 may be coupled to a number of other chip-lets that can be on the same die as SOC 1400 or on separate dies. These chip-lets include connectivity circuitry 1406, I/O controller 1407, power management 1408, and display system 1409, and peripheral connectivity 1410.

Connectivity 1406 represents hardware devices and software components for communicating with other devices. Connectivity 1406 may support various connectivity circuitries and standards. For example, connectivity 1406 may support GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. In some embodiments, connectivity 1406 may support non-cellular standards such as WiFi.

I/O controller 1407 represents hardware devices and software components related to interaction with a user. I/O controller 1407 is operable to manage hardware that is part of an audio subsystem and/or display subsystem. For example, input through a microphone or other audio device can provide input or commands for one or more applications or functions of SOC 1400. In some embodiments, I/O controller 1407 illustrates a connection point for additional devices that connect to SOC 1400 through which a user might interact with the system. For example, devices that can be attached to the SOC 1400 might include microphone devices, speaker or stereo systems, video systems or other display devices, keyboard or keypad devices, or other I/O devices for use with specific applications such as card readers or other devices.

Power management 1408 represents hardware or software that perform power management operations, e.g., based at least in part on receiving measurements from power measurement circuitries, temperature measurement circuitries, charge level of battery, and/or any other appropriate information that may be used for power management. By using majority and threshold gates of various embodiments, non-volatility is achieved at the output of these logic. Power management 1408 may accordingly put such logic into low power state without the worry of losing data. Power management may select a power state according to Advanced Configuration and Power Interface (ACPI) specification for one or all components of SOC 1400.

Display system 1409 represents hardware (e.g., display devices) and software (e.g., drivers) components that provide a visual and/or tactile display for a user to interact with the processor 1405. In some embodiments, display system 1409 includes a touch screen (or touch pad) device that provides both output and input to a user. Display system 1409 may include a display interface, which includes the particular screen or hardware device used to provide a display to a user. In some embodiments, the display interface includes logic separate from processor 1405 to perform at least some processing related to the display.

Peripheral connectivity 1410 may represent hardware devices and/or software devices for connecting to peripheral devices such as printers, chargers, cameras, etc. Peripheral connectivity 1410 may support communication protocols, e.g., PCIe (Peripheral Component Interconnect Express), USB (Universal Serial Bus), Thunderbolt, High Definition Multimedia Interface (HDMI), Firewire, etc.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Following examples are provided that illustrate the various embodiments. The examples can be combined with other examples. As such, various embodiments can be combined with other embodiments without changing the scope of the invention.

Example 1: An apparatus comprising: a first capacitor to receive a first input, the first capacitor coupled to a node; a second capacitor to receive a second input, the second capacitor coupled to the node; a third capacitor to receive a third input, wherein the third capacitor is coupled to the node, wherein the first capacitor, the second capacitor, and the third capacitor include non-linear polar material; a driver circuitry having a capacitive input coupled to the node, and an output which is to provide a majority or minority logic function of the first input, the second input, and the third input; and a reset mechanism coupled to the first capacitor, the second capacitor, the third capacitor, and the node, wherein the reset mechanism is to discharge the first capacitor, the second capacitor, the third capacitor in a reset phase separate from an evaluation phase.

Example 2: The apparatus of example 1, wherein the non-linear polar material includes a ferroelectric material, and wherein the reset mechanism is to set one of the first input, the second input, and the third input to a logic high during the reset phase, and to set two of the first input, the second input, and the third input to a logic low during the reset phase.

Example 3: The apparatus of example 1, wherein the reset mechanism comprises: a pull-up transistor coupled to the first capacitor and a power supply node, wherein the pull-up transistor is controllable by a first reset signal; a first pull-down transistor coupled to the second capacitor and a ground supply node, wherein the first pull-down transistor is controllable by a second reset signal; and a second pull-down transistor coupled to the third capacitor and the ground supply node, wherein the second pull-down transistor is controllable by a third reset signal.

Example 4: The apparatus of example 3 comprises a pass-gate coupled to the node and an input node to provide a pulse signal, wherein the pass-gate is controllable by a fourth reset signal.

Example 5: The apparatus of example 4, wherein the pulse signal has a pulse width shorter than pulse widths of the first reset signal, the second reset signal, and the third reset signal.

Example 6: The apparatus of example 5, wherein the pulse width of the pulse signal is within the pulse widths of the first reset signal, the second reset signal, and the third reset signal.

Example 7: The apparatus of example 1 comprises a linear capacitor coupled to the node and a ground supply node.

Example 8: The apparatus of example 2, wherein the ferroelectric material includes one of: bismuth ferrite (BFO), BFO with a doping material wherein the doping material is one of Lanthanum, or elements from lanthanide series of periodic table; lead zirconium titanate (PZT), or PZT with a doping material, wherein the doping material is one of La, Nb; relaxor ferroelectric which includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST); perovskite includes one of: $BaTiO_3$, $PbTiO_3$, $KNbO_3$, or $NaTaO_3$; hexagonal ferroelectric includes one of: $YMnO_3$, or $LuFeO_3$; hexagonal ferroelectrics of a type h-$RMnO_3$, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), Zirconium (Zr), Aluminum (Al), Silicon (Si), their oxides or their alloyed oxides; hafnium oxides as Hf1−x Ex Oy, where E can be Al, Ca, Ce, Dy, Er, Gd, Ge, La, Sc, Si, Sr, Sn, or Y; Al(1−x)Sc(x)N, Ga(1−x)Sc(x)N, Al(1−x)Y(x)N or Al(1−x−y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; niobate type compounds LiNbO3, LiTaO3, Lithium iron Tantalum Oxy Fluoride, Barium Strontium Niobate, Sodium Barium Niobate, or Potassium strontium niobate; or improper ferroelectric includes one of: [PTO/STO]n or [LAO/STO]n, where 'n' is between 1 to 100.

Example 9: The apparatus of example 3, wherein the reset mechanism comprises: a second pull-up device coupled to the node and the power supply node, wherein the second pull-up device is controllable by a fourth reset signal; and a third pull-down device coupled to the node and the ground supply node, wherein the third pull-down device is controllable by fifth reset signal.

Example 10: The apparatus of example 9, wherein the second pull-up device is turned on before the third pull-down device is turned on, and wherein the second pull-up device is turned off before the third pull-down device is turned off.

Example 11: The apparatus of example 1, wherein the first input, the second input, and the third input are digital signals.

Example 12: The apparatus of example 1, wherein the driver circuitry comprises an inverter.

Example 13: The apparatus of example 1, wherein the driver circuitry comprises a CMOS circuitry.

Example 14: The apparatus of example 1, wherein during the evaluation phase when the third input is at ground level, a voltage on the node is an AND logic function of the first input and the second input.

Example 15: The apparatus of example 1, wherein during the evaluation phase when the third input is at supply level, a voltage on the node is an OR logic function of the first input and the second input.

Example 16: An apparatus comprising: first, second, and third drivers to generate first, second, and third digital signals, respectively; first, second, and third non-linear capacitors to receive the first, second, and third digital signals, respectively; a node to sum charges of the first, second, and third non-linear capacitors; a CMOS logic to drive a voltage on the node; and a reset mechanism coupled to the first, second, third non-linear capacitors, and the node, wherein the reset mechanism is to discharge the first non-linear capacitor, the second non-linear capacitor, the third non-linear capacitor in a reset phase separate from an evaluation phase.

Example 17: The apparatus of example 16, wherein the first, second, and third non-linear capacitors include ferroelectric material, and wherein the reset mechanism is to set one of the first digital signal, the second digital signal, and the third digital signal to a logic high during the reset phase, and to set two of the first digital signal, the second digital signal, and the third digital signal to a logic low during the reset phase.

Example 18: The apparatus of example 16, wherein the reset mechanism comprises: a pull-up transistor coupled to the first non-linear capacitor and a power supply node, wherein the pull-up transistor is controllable by a first reset signal; a first pull-down transistor coupled to the second non-linear capacitor and a ground supply node, wherein the first pull-down transistor is controllable by a second reset signal; and a second pull-down transistor coupled to the third non-linear capacitor and the ground supply node, wherein the second pull-down transistor is controllable by a third reset signal.

Example 19: The apparatus of example 18, wherein the reset mechanism comprises: a second pull-up device coupled to the node and the power supply node, wherein the second pull-up device is controllable by a fourth reset signal; and a third pull-down device coupled to the node and the ground supply node, wherein the third pull-down device is controllable by fifth reset signal, wherein the second pull-up device is turn on before the third pull-down device is turned on, and wherein the second pull-up device is turned off before the third pull-down device is turned off.

Example 20: A system comprising: a processor circuitry to execute one or more instructions; a communication interface communicatively coupled to the processor circuitry; and a memory coupled to the processor circuitry, wherein the processor circuitry comprises a majority gate logic which includes: a first capacitor to receive a first input, the first capacitor coupled to a node; a second capacitor to receive a second input, the second capacitor coupled to the node; a third capacitor to receive a third input, wherein the third capacitor is coupled to the node, wherein the first capacitor, the second capacitor, and the third capacitor include non-linear polar material; and a driver circuitry having a capacitive input coupled to the node, and an output which is to provide a majority or minority logic function of the first input, the second input, and the third input; and a reset mechanism coupled to the first capacitor, the second capacitor, the third capacitor, and the node, wherein the reset mechanism is to discharge the first capacitor, the second capacitor, the third capacitor in a reset phase separate from an evaluation phase.

Example 1b: An apparatus comprising: a first capacitor to receive a first input, the first capacitor coupled to a node; a second capacitor to receive a second input, the second capacitor coupled to the node; a third capacitor to receive a third input, wherein the third capacitor is coupled to the node, wherein the first capacitor, the second capacitor, and the third capacitor include paraelectric material; a driver circuitry having a capacitive input coupled to the node, and an output which is to provide a majority or minority logic function of the first input, the second input, and the third input; and a reset mechanism coupled to the first capacitor, the second capacitor, the third capacitor, and the node, wherein the reset mechanism is to discharge the first capacitor, the second capacitor, the third capacitor in a reset phase separate from an evaluation phase.

Example 2b: The apparatus of example 1b, wherein the reset mechanism is to set the first input, the second input, and the third input to a logic low during the reset phase, and to allow data to control two or more of the first input, the second input, and the third input during the evaluation phase.

Example 3b: The apparatus of example 1b, wherein the reset mechanism comprises: a first pull-down transistor coupled to the first capacitor and a ground supply node, wherein the first pull-down transistor is controllable by a first reset signal; a second pull-down transistor coupled to the second capacitor and the ground supply node, wherein second first pull-down transistor is controllable by a second reset signal; and a third pull-down transistor coupled to the third capacitor and the ground supply node, wherein the third pull-down transistor is controllable by a third reset signal.

Example 4b: The apparatus of example 3b comprises the reset mechanism a fourth pull-down transistor coupled to the node and the ground supply node, wherein the fourth pull-down transistor is controllable by a fourth reset signal.

Example 5b: The apparatus of example 4b, wherein the fourth reset signal has a pulse width shorter than pulse widths of the first reset signal, the second reset signal, and the third reset signal.

Example 6b: The apparatus of example 5b, wherein the pulse width of the fourth reset signal is within the pulse widths of the first reset signal, the second reset signal, and the third reset signal.

Example 7b: The apparatus of example 1b comprises a linear capacitor coupled to the node and a ground supply node.

Example 8b: The apparatus of example 1b, wherein the paraelectric material includes one of: SrTiO3, Ba(x)Sr(y)TiO3 (where x is −0.5, and y is 0.95), HfZrO2, Hf—Si—O, La-substituted PbTiO3, or PMN-PT based relaxor ferroelectrics.

Example 9b: The apparatus of example 1b, wherein the first input, the second input, and the third input are digital signals.

Example 10b: The apparatus of example 1b, wherein the driver circuitry comprises an inverter.

Example 11b: The apparatus of example 1b, wherein the driver circuitry comprises a CMOS circuitry.

Example 12b: The apparatus of example 1b, wherein during the evaluation phase when the third input is at ground level, a voltage on the node is an AND logic function of the first input and the second input.

Example 13b: The apparatus of example 1b, wherein during the evaluation phase when the third input is at supply level, a voltage on the node is an OR logic function of the first input and the second input.

Example 14b: An apparatus comprising: first, second, and third drivers to generate first, second, and third digital signals, respectively; first, second, and third paraelectric capacitors to receive the first, second, and third digital signals, respectively; a node to sum charges of the first, second, and third paraelectric capacitors; a CMOS logic to drive a voltage on the node; and a reset mechanism coupled to the first paraelectric capacitor, the second paraelectric capacitor, the third paraelectric capacitor, and the node, wherein the reset mechanism is to discharge the first paraelectric capacitor, the second paraelectric capacitor, and the third paraelectric capacitor in a reset phase separate from an evaluation phase.

Example 15b: The apparatus of example 14b, wherein the reset mechanism is to set the first digital signal, the second digital signal, and the third digital signal to a logic low during the reset phase.

Example 16b: The apparatus of example 14b, wherein the reset mechanism comprises: a first pull-down transistor coupled to the first paraelectric capacitor and a ground supply node, wherein the first pull-down transistor is controllable by a first reset signal; a second pull-down transistor coupled to the second paraelectric capacitor and the ground supply node, wherein second first pull-down transistor is controllable by a second reset signal; and a third pull-down transistor coupled to the third paraelectric capacitor and the ground supply node, wherein the third pull-down transistor is controllable by a third reset signal.

Example 17b: The apparatus of example 14b, wherein the first paraelectric capacitor, the second paraelectric capacitor, the third paraelectric capacitor include: SrTiO3, Ba(x)Sr(y)TiO3 (where x is −0.5, and y is 0.95), HfZrO2, Hf—Si—O, La-substituted PbTiO3, or PMN-PT based relaxor ferroelectrics.

Example 18b: The apparatus of example 16b, wherein the reset mechanism comprises a fourth pull-down transistor coupled to the node and the ground supply node, wherein the fourth pull-down transistor is controllable by a fourth reset signal, wherein the fourth reset signal has a pulse width shorter than pulse widths of the first reset signal, the second reset signal, and the third reset signal, and wherein the pulse width of the fourth reset signal is within the pulse widths of the first reset signal, the second reset signal, and the third reset signal.

Example 19b: A system comprising: a processor circuitry to execute one or more instructions; a communication interface communicatively coupled to the processor circuitry; and a memory coupled to the processor circuitry, wherein the processor circuitry comprises a majority gate logic which includes: a first capacitor to receive a first input, the first capacitor coupled to a node; a second capacitor to receive a second input, the second capacitor coupled to the node; a third capacitor to receive a third input, wherein the third capacitor is coupled to the node, wherein the first capacitor, the second capacitor, and the third capacitor include paraelectric material; a driver circuitry having a capacitive input coupled to the node, and an output which is to provide a majority or minority logic function of the first input, the second input, and the third input; and a reset mechanism coupled to the first capacitor, the second capacitor, the third capacitor, and the node, wherein the reset mechanism is to discharge the first capacitor, the second capacitor, the third capacitor in a reset phase separate from an evaluation phase.

Example 20b: The system of example 19b, wherein the reset mechanism is to set the first input, the second input, and the third input to a logic low during the reset phase, and to allow data to control two or more of the first input, the second input, and the third input during the evaluation phase, wherein the reset mechanism comprises: a first pull-down transistor coupled to the first capacitor and a ground supply node, wherein the first pull-down transistor is controllable by a first reset signal; a second pull-down transistor coupled to the second capacitor and the ground supply node, wherein second pull-down transistor is controllable by a second reset signal; a third pull-down transistor coupled to the third capacitor and the ground supply node, wherein the third pull-down transistor is controllable by a third reset signal; and a fourth pull-down transistor coupled to the node and the ground supply node, wherein the fourth pull-down transistor is controllable by a fourth reset signal.

Example 1c: An apparatus comprising: a first capacitor to receive a first input, the first capacitor coupled to a node; a second capacitor to receive a second input, the second capacitor coupled to the node; a third capacitor to receive a third input, wherein the third capacitor is coupled to the node, wherein the first capacitor, the second capacitor, and the third capacitor include ferroelectric material; and a reset mechanism coupled to the first capacitor, the second capacitor, the third capacitor, and the node, wherein the reset mechanism is to condition the first, second and third inputs in a reset phase separate from an evaluation phase.

Example 2c: The apparatus of example 1c, wherein the reset mechanism is to tri-state drivers of the first, second and third inputs to inhibit propagation of data signals to the first, second and third inputs during the reset phase.

Example 3c: The apparatus of example 1c, wherein the reset mechanism is to enable drivers of the first, second and third inputs to propagate data signals to the first, second and third inputs during the evaluation phase.

Example 4c: The apparatus of example 1c, wherein the reset mechanism is to disable conditioning of the first, second and third inputs during the evaluation phase.

Example 5c: The apparatus of example 1c, wherein the reset mechanism is to condition one of the first input, the second input, and the third input to a logic high during the reset phase, and to condition two of the first input, the second input, and the third input to a logic low during the reset phase.

Example 6c: The apparatus of example 1c comprises: a driver circuitry having a capacitive input coupled to the node, and an output which is to provide a majority or minority logic function of the first input, the second input, and the third input.

Example 7c: The apparatus of example 1c, wherein the reset mechanism comprises a pass-gate coupled to the node and an input node to provide a pulse signal, wherein the pass-gate is controllable by a reset signal.

Example 8c: The apparatus of example 7c, wherein the pulse signal has a pulse width shorter than a duration of the reset phase.

Example 9c: The apparatus of example 8c, wherein the pulse width of the pulse signal arrives after the reset phase begins and after the reset mechanism conditions the first input, the second, input and the third input.

Example 10c: The apparatus of example 1c comprises a linear capacitor coupled to the node and a ground supply node.

Example 11c: The apparatus of claim 1, wherein the ferroelectric material includes one of: bismuth ferrite (BFO), BFO with a doping material wherein the doping material is one of Lanthanum, or elements from lanthanide series of periodic table; lead zirconium titanate (PZT), or PZT with a doping material, wherein the doping material is one of La, Nb; relaxor ferroelectric which includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST); perovskite includes one of: BaTiO3, PbTiO3, KNbO3, or NaTaO3; hexagonal ferroelectric includes one of: YMnO3, or LuFeO3; hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); hafnium (Hf), Zirconium (Zr), Aluminum (Al), Silicon (Si), their oxides or their alloyed oxides; hafnium oxides as Hf1−x Ex Oy, where E can be Al, Ca, Ce, Dy, er, Gd, Ge, La, Sc, Si, Sr, Sn, or Y; Al(1−x)Sc(x)N, Ga(1−x)Sc(x)N, Al(1−x)Y(x)N or Al(1−x−y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; niobate type compounds LiNbO3, LiTaO3, Lithium iron Tantalum Oxy Fluoride, Barium Strontium Niobate, Sodium Barium Niobate, or Potassium strontium niobate; or improper ferroelectric includes one of: [PTO/STO]n or [LAO/STO]n, where 'n' is between 1 to 100.

Example 12c: The apparatus of example 1c, wherein the first input, the second input, and the third input are digital signals.

Example 13c: The apparatus of example 6c, wherein the driver circuitry one of: an inverter, a CMOS circuitry, a majority or minority gate.

Example 14c: The apparatus of example 1c, wherein during the evaluation phase when the third input is at ground level, a voltage on the node is an AND logic function of the first input and the second input.

Example 15c: The apparatus of example 1c, wherein during the evaluation phase when the third input is at supply level, a voltage on the node is an OR logic function of the first input and the second input.

Example 16c: An apparatus comprising: first, second, and third drivers to generate first, second, and third digital signals, respectively; first, second, and third non-linear capacitors to receive the first, second, and third digital signals, respectively; a node to sum charges of the first, second, and third non-linear capacitors, wherein the first, second, and third non-linear capacitors comprise non-linear polar material which includes a ferroelectric material; a CMOS logic to drive a voltage on the node; and a reset mechanism coupled to the first capacitor, the second capacitor, the third capacitor, and the node, wherein the reset mechanism is to condition the first, second and third digital signals in a reset phase separate from an evaluation phase.

Example 17c: The apparatus of example 16c, wherein the reset mechanism is to condition one of the first digital signal, the second digital signal, and the third digital signal to a logic high during the reset phase, and to condition two of the first digital signal, the second digital signal, and the third digital signal to a logic low during the reset phase.

Example 18c: The apparatus of example 1c, wherein: the reset mechanism is to tri-state drivers of the first, second and third inputs to inhibit propagation of data signals as the first digital signal, second digital signal and third digital signal during the reset phase; reset mechanism is to enable drivers of the first, second and third digital signals to propagate data signals as the first, second and third digital signals during the evaluation phase; and reset mechanism is to disable conditioning of the first, second and third digital signals during the evaluation phase.

Example 19c: A system comprising: a processor circuitry to execute one or more instructions; a communication interface communicatively coupled to the processor circuitry; and a memory coupled to the processor circuitry, wherein the processor circuitry comprises a majority gate logic which includes: a first capacitor to receive a first input, the first capacitor coupled to a node; a second capacitor to receive a second input, the second capacitor coupled to the node; a third capacitor to receive a third input, wherein the third capacitor is coupled to the node, wherein the first capacitor, the second capacitor, and the third capacitor include ferroelectric material; and a reset mechanism coupled to the first capacitor, the second capacitor, the third capacitor, and the node, wherein the reset mechanism is to condition the first, second and third inputs in a reset phase separate from an evaluation phase.

Example 20c: The system of example 19c, wherein: the reset mechanism is to tri-state drivers of the first, second and third inputs to inhibit propagation of data signals to the first, second and third inputs during the reset phase; the reset mechanism is to enable drivers of the first, second and third inputs to propagate data signals to the first, second and third inputs during the evaluation phase; and the reset mechanism is to disable conditioning of the first, second and third inputs during the evaluation phase.

Example 1d: An apparatus comprising: a first capacitor to receive a first input, the first capacitor coupled to a node; a second capacitor to receive a second input, the second capacitor coupled to the node; a third capacitor to receive a third input, wherein the third capacitor is coupled to the node, wherein the first capacitor, the second capacitor, and the third capacitor include paraelectric material; and a reset mechanism coupled to the first capacitor, the second capacitor, the third capacitor, and the node, wherein the reset mechanism is to condition the first, second and third inputs in a reset phase separate from an evaluation phase.

Example 2d: The apparatus of example 1d, wherein the reset mechanism is to tri-state drivers of the first, second and third inputs to inhibit propagation of data signals to the first, second and third inputs during the reset phase.

Example 3d: The apparatus of example 1d, wherein the reset mechanism is to condition the first input, the second input, and the third input to a logic low during the reset phase.

Example 4d: The apparatus of example 1d, wherein the reset mechanism is to enable drivers of the first, second and third inputs to propagate data signals to the first, second and third inputs during the evaluation phase.

Example 5d: The apparatus of example 1d, wherein the reset mechanism is to disable conditioning of the first, second and third inputs during the evaluation phase.

Example 6d: The apparatus of example 1d wherein the reset mechanism comprises a pull-down transistor coupled to the node and a ground supply node, wherein the pull-down transistor is controllable by a reset signal.

Example 7d: The apparatus of example 6d, wherein the reset signal has a pulse width shorter than a duration of the reset phase.

Example 8d: The apparatus of example 7d, wherein the pulse width of the pulse signal arrives after the reset phase begins and after the reset mechanism conditions the first input, the second, input and the third input.

Example 9d: The apparatus of example 1d comprises a driver circuitry having a capacitive input coupled to the node, and an output which is to provide a majority or minority logic function of the first input, the second input, and the third input.

Example 10d: The apparatus of example 1d, wherein the paraelectric material includes one of: SrTiO3, Ba(x)Sr(y)TiO3 (where x is −0.5, and y is 0.95), HfZrO2, Hf—Si—O, La-substituted PbTiO3, or PMN-PT based relaxor ferroelectrics.

Example 11d: The apparatus of example 1d, wherein the paraelectric material includes one or more of: Sr, Ti, Ba, Hf, Zr, La, or Pb.

Example 12d: The apparatus of example 1d, wherein the first input, the second input, and the third input are digital signals.

Example 13d: The apparatus of example 9d, wherein the driver circuitry one of: an inverter, a CMOS circuitry, a majority or minority gate.

Example 14d: The apparatus of example 1d, wherein: during the evaluation phase when the third input is at ground level, a voltage on the node is an AND logic function of the first input and the second input; or during the evaluation phase when the third input is at supply level, a voltage on the node is an OR logic function of the first input and the second input.

Example 15d: An apparatus comprising: first, second, and third drivers to generate first, second, and third digital signals, respectively; first, second, and third paraelectric capacitors to receive the first, second, and third digital signals, respectively; a node to sum charges of the first, second, and third paraelectric capacitors; a CMOS logic to drive a voltage on the node; and a reset mechanism coupled to the first paraelectric capacitor, the second paraelectric capacitor, the third paraelectric capacitor, and the node, wherein the reset mechanism is to condition the first, second and third digital signals in a reset phase separate from an evaluation phase.

Example 16d: The apparatus of example 15d, wherein the reset mechanism is to condition the first, second, and third digital signals to a logic low during the reset phase.

Example 17d: The apparatus of example 15d, wherein the reset mechanism comprises: a pull-down transistor coupled to the node and a ground supply node, wherein the pull-down transistor is controllable by a reset signal, wherein the reset signal has a pulse width shorter than a duration of the reset phase, and wherein the pulse width of the reset signal arrives after the first, second, and third digital signals are conditioned.

Example 18d: The apparatus of example 15d, wherein the first paraelectric capacitor, the second paraelectric capacitor, the third paraelectric capacitor include: SrTiO3, Ba(x)Sr(y)TiO3 (where x is −0.5, and y is 0.95), HfZrO2, Hf—Si—O, La-substituted PbTiO3, or PMN-PT based relaxor ferroelectrics.

Example 19d: A system comprising: a processor circuitry to execute one or more instructions; a communication interface communicatively coupled to the processor circuitry; and a memory coupled to the processor circuitry, wherein the processor circuitry comprises a majority gate logic which includes: a first capacitor to receive a first input, the first capacitor coupled to a node; a second capacitor to receive a second input, the second capacitor coupled to the node; a third capacitor to receive a third input, wherein the third capacitor is coupled to the node, wherein the first capacitor, the second capacitor, and the third capacitor include paraelectric material; and a reset mechanism coupled to the first capacitor, the second capacitor, the third capacitor, and the node, wherein the reset mechanism is to condition the first, second and third inputs in a reset phase separate from an evaluation phase.

Example 20d: The system of example 19d, wherein the reset mechanism is to: tri-state drivers of the first, second and third inputs to inhibit propagation of data signals to the first, second and third inputs during the reset phase; condition the first input, the second input, and the third input to a logic low during the reset phase; enable drivers of the first, second and third inputs to propagate data signals to the first, second and third inputs during the evaluation phase; and disable conditioning of the first, second and third inputs during the evaluation phase, and wherein the reset mechanism comprises a pull-down transistor coupled to the node and a ground supply node, wherein the pull-down transistor is controllable by a reset signal.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:
1. An apparatus comprising:
   a first capacitor to receive a first input, the first capacitor coupled to a node;
   a second capacitor to receive a second input, the second capacitor coupled to the node;
   a third capacitor to receive a third input, wherein the third capacitor is coupled to the node, wherein the first capacitor, the second capacitor, and the third capacitor include paraelectric material; and a reset mechanism coupled to the first capacitor, the second capacitor, the third capacitor, and the node, wherein the reset mechanism is to condition the first input, the second input, and the third input in a reset phase separate from an evaluation phase, wherein the reset mechanism comprises a pull-down transistor coupled to the node and a ground supply node, wherein the pull-down transistor is controllable by a reset signal, and wherein the reset signal has a pulse width shorter than or equal to a duration of the reset phase.

2. The apparatus of claim 1, wherein the reset mechanism is to tri-state drivers of the first input, the second input, and third input to inhibit propagation of data signals to the first input, the second input, and the third input during the reset phase.

3. The apparatus of claim 1, wherein the reset mechanism is to condition the first input, the second input, and the third input to a logic low during the reset phase.

4. The apparatus of claim 1, wherein the reset mechanism is to enable drivers of the first input, the second input, and the third input to propagate data signals to the first input, the second input, and the third input during the evaluation phase.

5. The apparatus of claim 1, wherein the reset mechanism is to disable conditioning of the first input, the second input, and the third input during the evaluation phase.

6. The apparatus of claim 1, wherein the pulse width of the reset signal arrives after the reset phase begins and after the reset mechanism conditions the first input, the second input, and the third input.

7. The apparatus of claim 1 comprises a driver circuitry having a capacitive input coupled to the node, and an output which is to provide a majority or minority logic function of the first input, the second input, and the third input.

8. The apparatus of claim 7, wherein the driver circuitry is one of: an inverter, a CMOS circuitry, a majority gate, or minority gate.

9. The apparatus of claim 1, wherein the paraelectric material includes one of: SrTiO3, Ba(x)Sr(y)TiO3, HfZrO2, Hf—Si—O, La-substituted PbTiO3, or PMN-PT based relaxor ferroelectrics.

10. The apparatus of claim 1, wherein the paraelectric material includes one or more of: Sr, Ti, Ba, Hf, Zr, La, or Pb.

11. The apparatus of claim 1, wherein the first input, the second input, and the third input are digital signals.

12. The apparatus of claim 1, wherein:
during the evaluation phase when the third input is at ground level, a voltage on the node is an AND logic function of the first input and the second input; or
during the evaluation phase when the third input is at supply level, a voltage on the node is an OR logic function of the first input and the second input.

13. An apparatus comprising:
a first driver, a second driver, and a third driver to generate a first digital signal, a second digital signal, and a third digital signal, respectively;
a first paraelectric capacitor, a second paraelectric capacitor, and a third paraelectric capacitor to receive the first digital signal, the second digital signal, and the third digital signal, respectively;
a node to sum charges of the first paraelectric capacitor, the second paraelectric capacitor, and the third paraelectric capacitor;

a CMOS logic to drive a voltage on the node; and
a reset mechanism coupled to the first paraelectric capacitor, the second paraelectric capacitor, the third paraelectric capacitor, and the node, wherein the reset mechanism is to condition the first digital signal, the second digital signal, and the third digital signal in a reset phase separate from an evaluation phase, wherein the reset mechanism comprises a pull-down transistor coupled to the node and a ground supply node, wherein the pull-down transistor is controllable by a reset signal, and wherein the reset signal has a pulse width shorter than a duration of the reset phase.

14. The apparatus of claim 13, wherein the reset mechanism is to condition the first digital signal, the second digital signal, and the third digital signal to a logic low during the reset phase.

15. The apparatus of claim 13,
wherein the pulse width of the reset signal arrives after the first digital signal, the second digital signal, and the third digital signal are conditioned.

16. The apparatus of claim 13, wherein the first paraelectric capacitor, the second paraelectric capacitor, the third paraelectric capacitor include: SrTiO3, Ba(x)Sr(y)TiO3, HfZrO2, Hf—Si—O, La-substituted PbTiO3, or PMN-PT based relaxor ferroelectrics.

17. A system comprising:
a processor circuitry to execute one or more instructions;
a communication interface communicatively coupled to the processor circuitry; and
a memory coupled to the processor circuitry, wherein the processor circuitry comprises a majority gate logic which includes:
a first capacitor to receive a first input, the first capacitor coupled to a node;
a second capacitor to receive a second input, the second capacitor coupled to the node;
a third capacitor to receive a third input, wherein the third capacitor is coupled to the node, wherein the first capacitor, the second capacitor, and the third capacitor include paraelectric material; and
a reset mechanism coupled to the first capacitor, the second capacitor, the third capacitor, and the node, wherein the reset mechanism is to condition the first input, the second input, and the third input in a reset phase separate from an evaluation phase, wherein the reset mechanism comprises a pull-down transistor coupled to the node and a ground supply node, wherein the pull-down transistor is controllable by a reset signal, and wherein the reset signal has a pulse width shorter than or equal to a duration of the reset phase.

18. The system of claim 17, wherein the reset mechanism is to:
tri-state drivers of the first input, the second input, and the third input to inhibit propagation of data signals to the first input, the second input, and the third input during the reset phase;
condition the first input, the second input, and the third input to a logic low during the reset phase;
enable drivers of the first input, the second input, and the third input to propagate data signals to the first input, the second input, and the third input during the evaluation phase; and
disable conditioning of the first input, the second input, and the third input during the evaluation phase.

* * * * *